(12) United States Patent
Kato et al.

(10) Patent No.: US 8,944,077 B2
(45) Date of Patent: Feb. 3, 2015

(54) FILM DEPOSITION APPARATUS, CLEANING METHOD FOR THE SAME, AND COMPUTER STORAGE MEDIUM STORING PROGRAM

(75) Inventors: Hitoshi Kato, Oshu (JP); Manabu Honma, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 1107 days.

(21) Appl. No.: 12/617,779

(22) Filed: Nov. 13, 2009

(65) Prior Publication Data

US 2010/0122710 A1    May 20, 2010

(30) Foreign Application Priority Data

Nov. 19, 2008   (JP) .................................. 2008-295640
Nov. 5, 2009    (JP) .................................. 2009-253593

(51) Int. Cl.
| | | |
|---|---|---|
| C23C 16/00 | (2006.01) | |
| B08B 7/00 | (2006.01) | |
| C23C 16/44 | (2006.01) | |
| H01L 21/67 | (2006.01) | |
| H01L 21/687 | (2006.01) | |

(52) U.S. Cl.
CPC ........... *B08B 7/0035* (2013.01); *C23C 16/4405* (2013.01); *H01L 21/67028* (2013.01); *H01L 21/68764* (2013.01); *H01L 21/68771* (2013.01)
USPC ................ 134/94.1; 134/61; 134/85; 118/70; 118/719; 118/728; 118/730

(58) Field of Classification Search
CPC ................... H01L 21/68714; H01L 21/68785; H01L 21/68792; H01L 21/68764; H01L 21/68771; H01J 37/3244; C23C 16/458; C23C 16/4582; C23C 16/4583; C23C 16/4584; C23C 16/4585; C23C 16/4586; C23C 16/45551; C23C 16/45548; C23C 16/4554

See application file for complete search history.

(56) References Cited

U.S. PATENT DOCUMENTS

| | | | | |
|---|---|---|---|---|
| 4,616,597 A | * | 10/1986 | Kaganowicz | ............. 118/723 E |
| 2004/0052972 A1 | * | 3/2004 | Schmitt | ........................ 427/569 |
| 2006/0137820 A1 | * | 6/2006 | Lee et al. | ................. 156/345.37 |

FOREIGN PATENT DOCUMENTS

| | | |
|---|---|---|
| JP | 2000-167383 | 6/2000 |
| JP | 2002-313727 | 10/2002 |

* cited by examiner

*Primary Examiner* — Michael Kornakov
*Assistant Examiner* — Ryan Coleman
(74) *Attorney, Agent, or Firm* — IPUSA, PLLC

(57) ABSTRACT

A disclosed film deposition apparatus includes a susceptor provided rotatably in a chamber; a substrate receiving portion provided in one surface of the susceptor, for receiving a substrate; a reaction gas supplying member configured to supply a reaction gas to the one surface of the susceptor; a cleaning member including: a first concave member that is provided above the susceptor and open toward the one surface, thereby defining a space of an inverted concave shape, a second concave member provided over the first concave member to define a gas passage between the first concave member and the second concave member, a cleaning gas supplying portion configured to supply a cleaning gas to the space, and an evacuation pipe configured to be in gaseous communication with the gas passage and extend out from the chamber; and an evacuation opening provided in the chamber in order to evacuate the chamber.

7 Claims, 21 Drawing Sheets

FILM DEPOSITION APPARATUS, CLEANING METHOD FOR THE SAME, AND COMPUTER STORAGE MEDIUM STORING PROGRAM

CROSS-REFERENCE TO RELATED APPLICATION

This application claims the benefit of priority of Japanese Patent Applications No. 2008-295640 and No. 2009-253593, filed on Nov. 19, 2008 and Nov. 5, 2009, respectively, with the Japanese Patent Office, the entire contents of which are hereby incorporated by reference.

BACKGROUND OF THE INVENTION

1. Field of the Invention

The present invention relates to a film deposition apparatus for use in semiconductor device fabrication and the like, a cleaning method of cleaning the film deposition apparatus, and a computer readable storage medium storing a program for causing the film deposition apparatus to perform the cleaning method.

2. Description of the Related Art

In a film deposition apparatus for use in semiconductor device fabrication and the like, a predetermined film is deposited on not only a substrate but an upper surface of the susceptor on which the substrate is placed. When film deposition is repeated and thus the film is deposited on the susceptor to a certain thickness, the film may peel off from the upper surface of the susceptor causing particles to be generated. To prevent such particle generation, the susceptor has to be cleaned in order to remove such films on the upper surface by supplying a cleaning gas (see Japanese Patent Application Laid-Open Publications Nos. 2000-167383 and 2002-313727.)

A cleaning gas to be used for cleaning the susceptor may be used for etching, for example, a silicon oxide film or a silicon nitride film, however this may cause an inner surface of the chamber made of, for example, stainless steel or aluminum, to corrode. Therefore, in order to prevent the inner surface of the chamber from being corroded, the chamber needs to be made of anti-corrosive materials, or the inner surface of the chamber needs to be coated with anti-corrosive materials, which leads to an increase in a production cost of the chamber.

SUMMARY OF THE INVENTION

The present invention has been made in view of the above, and provides a film deposition apparatus in which deposits on a susceptor can be removed without excessively exposing an inner surface of the film deposition apparatus to the cleaning gas, a cleaning method of cleaning the film deposition apparatus, and a computer readable storage medium storing a program for causing the film deposition apparatus to perform the cleaning method.

A first aspect of the present invention provides a film deposition apparatus comprising: a susceptor provided rotatably in a chamber; a substrate receiving portion that is provided in one surface of the susceptor and a substrate is placed in; a reaction gas supplying member configured to supply a reaction gas to the one surface of the susceptor; a cleaning member including: a first concave member that is provided above the susceptor and open toward the one surface, thereby defining a space of an inverted concave shape, a second concave member that is provided over the first concave member in order to define a gas passage between the first concave member and the second concave member, a cleaning gas supplying portion configured to supply a cleaning gas to the space defined by the first concave member, and an evacuation pipe configured to be in gaseous communication with the gas passage and to extend out from the chamber; and an evacuation opening provided in the chamber in order to evacuate the chamber.

A second aspect of the present invention provides a cleaning method of cleaning a film deposition apparatus, the cleaning method comprising steps of: rotating a susceptor rotatably provided in a chamber of the film deposition apparatus and including a substrate receiving portion in which a substrate is placed in one surface of the susceptor; supplying a cleaning gas to a space defined by a first concave member provided above the susceptor and open toward the one surface; and evacuating the cleaning gas through a gas passage between the first concave member and a second concave member provided over the first concave member.

A third aspect of the present invention provides a computer readable storage medium storing a program for causing the film deposition apparatus of the first aspect to perform a cleaning method of cleaning the film deposition apparatus, the cleaning method comprising steps of: rotating a susceptor rotatably provided in a chamber of the film deposition apparatus and including a substrate receiving portion in which a substrate is placed in one surface of the susceptor; supplying a cleaning gas to a space defined by a first concave member provided above the susceptor and open toward the one surface; and evacuating the cleaning gas through a gas passage between the first concave member and a second concave member provided over the first concave member.

DETAILED DESCRIPTION OF THE PREFERRED EMBODIMENT

According to an embodiment of the present invention, there are provided a film deposition apparatus in which deposits on a susceptor can be removed without excessively exposing an inner surface of the film deposition apparatus to the cleaning gas, a cleaning method of cleaning the film deposition apparatus, and a computer readable storage medium storing a program for causing the film deposition apparatus to perform the cleaning method.

Referring to the accompanying drawings, a film deposition apparatus according to an embodiment of the present invention will be explained in the following.

Figure 1:
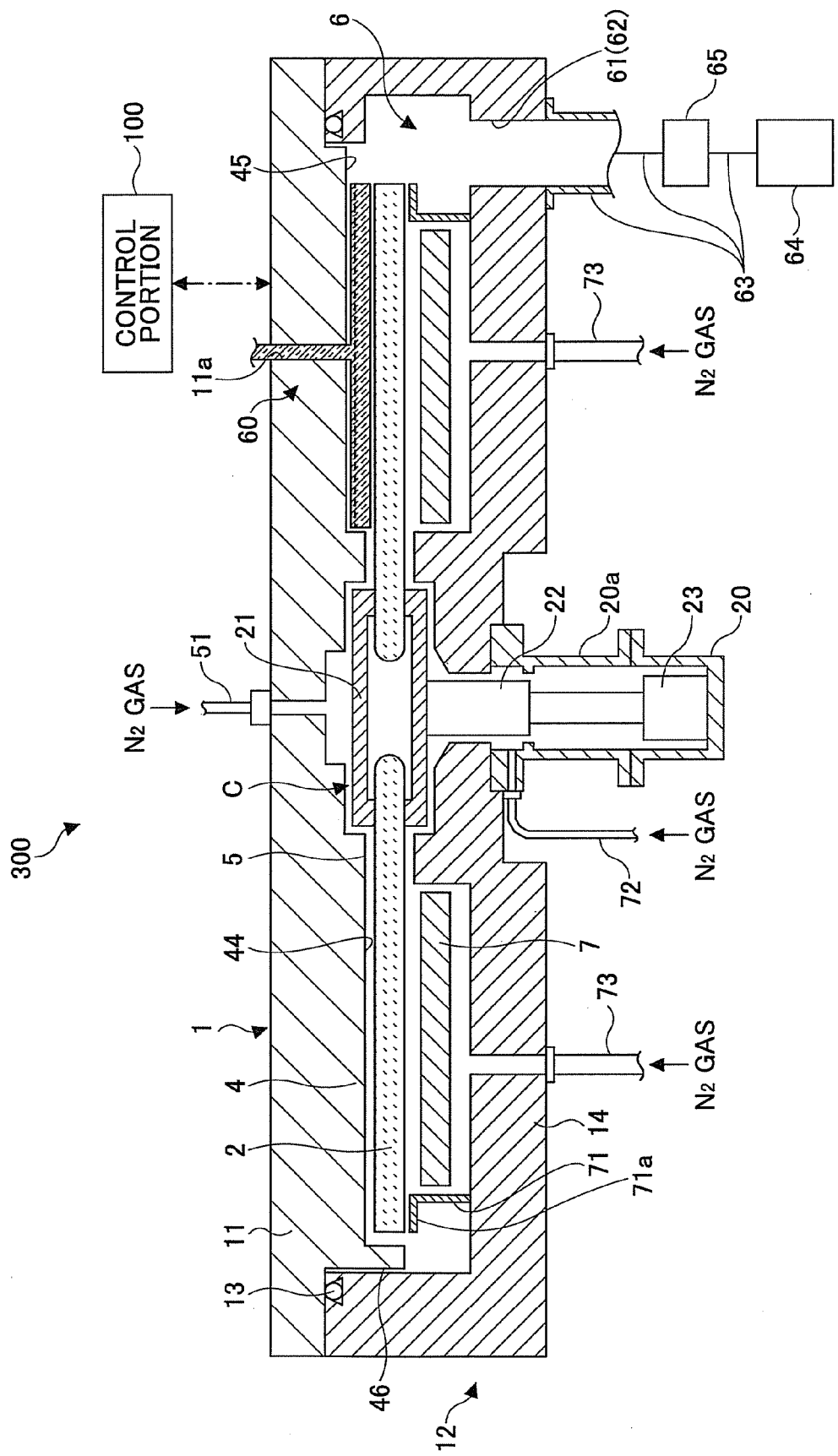
FIG. 1 is a schematic view illustrating a film deposition apparatus according to an embodiment of the present invention.
Figure 3:
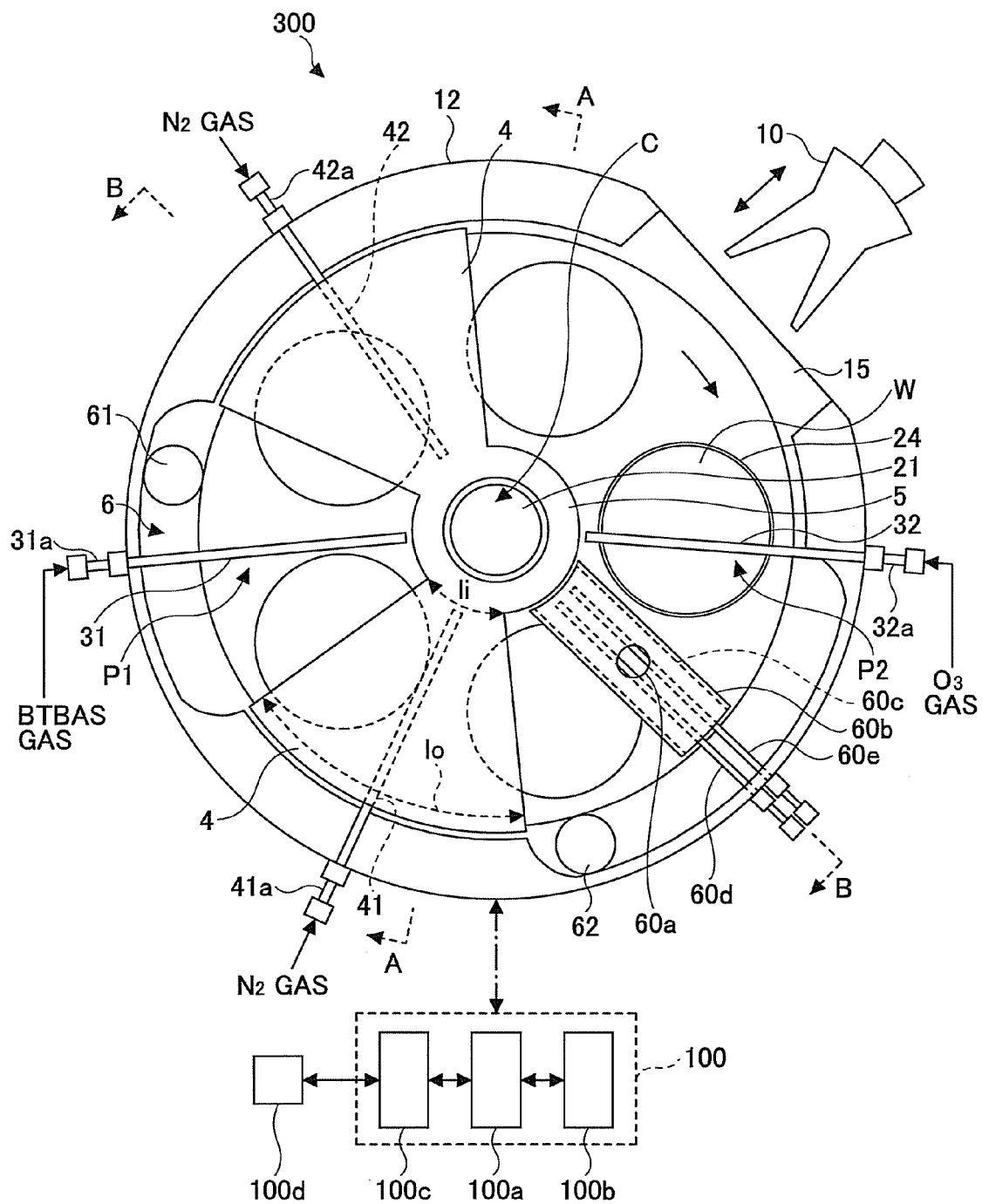
FIG. 3 is a plan view illustrating the inner configuration of the film deposition apparatus of FIG. 1.

Referring to FIG. 1, which is a cross-sectional view taken along line B-B in FIG. 3, a film deposition apparatus 300 according to this embodiment of the present invention has a vacuum chamber 1 having a flattened cylinder shape, and a susceptor 2 that is located inside the vacuum chamber 1 and has a rotation center at a center of the vacuum chamber 1. The vacuum chamber 1 is made so that a ceiling plate 11 can be separated from a chamber body 12. The ceiling plate 11 is pressed onto the chamber body 12 via a sealing member 13 such as an O ring, so that the vacuum chamber 1 is hermetically sealed. On the other hand, the ceiling plate 11 can be raised by a driving mechanism (not shown) when the ceiling plate 11 has to be removed from the chamber body 12.

The susceptor 2 is made of a carbon plate having a thickness of about 20 mm in this embodiment and has a shape of a circular plate having a diameter of about 960 mm. An upper surface, a lower surface, and a side surface of the susceptor 2 may be coated with silicon carbide (SiC). As shown in FIG. 1, the susceptor 2 has an opening in the center and is supported such that a core portion 21 sandwiches the susceptor 2 around the opening. The core portion 21 is fixed on a top end of a rotational shaft 22 that extends in a vertical direction. The rotational shaft 22 penetrates a bottom portion 14 of the chamber body 12 and is fixed at the lower end to a driving mechanism 23 that can rotate the rotational shaft 22 around a vertical axis (for example, in a rotation direction RD shown in FIG. 2) in this embodiment. The rotational shaft 22 and the driving mechanism 23 are housed in a case body 20 having a cylinder with a bottom. The case body 20 is hermetically fixed to a lower surface of the bottom portion 14 via a flanged pipe portion 20a, which isolates an inner environment of the case body 20 from an outer environment.

Figure 2:
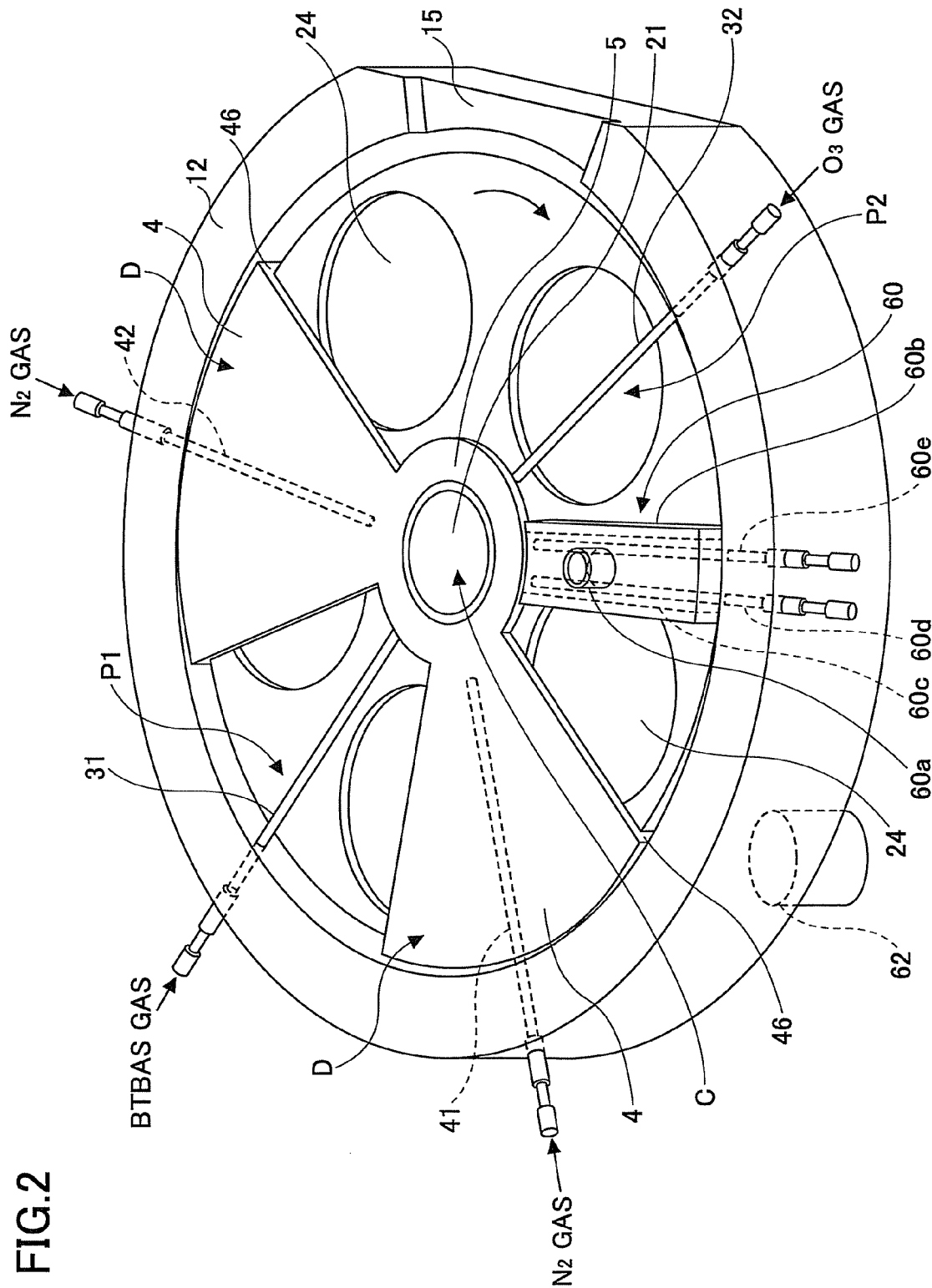
FIG. 2 is a perspective view illustrating an inner configuration of the film deposition apparatus of FIG. 1.

As shown in FIGS. 2 and 3, plural (five in the illustrated example) wafer receiving portions 24 having a circular concave shape, each of which receives a wafer W, are formed in an upper surface of the susceptor 2, although only one wafer W is illustrated in FIG. 3. The wafer receiving portions 24 are arranged at equal angular intervals of about 72°.

Figure 4:
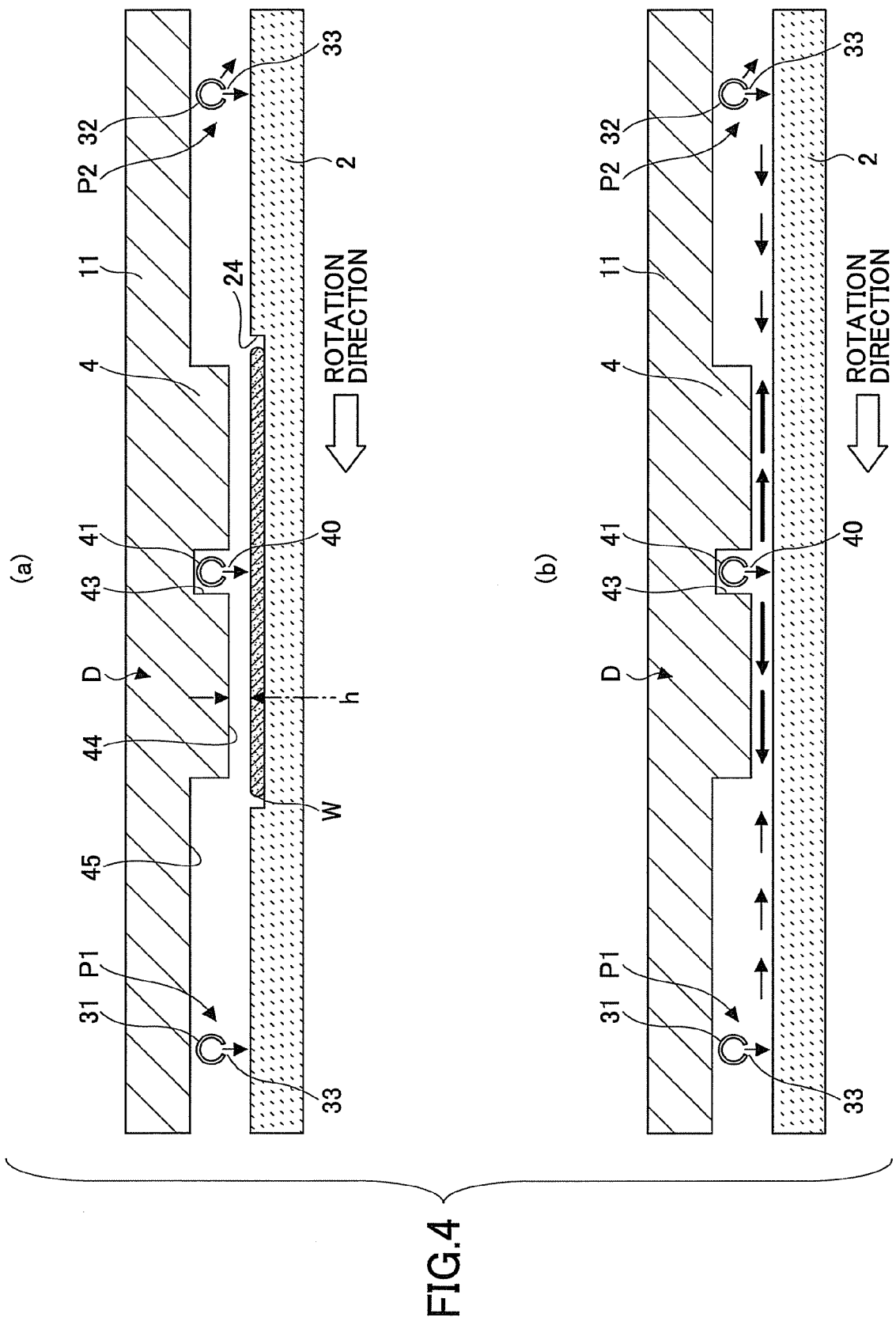
FIG. 4 illustrates a spatial relationship among a gas supplying nozzle, a susceptor, and a convex portion of the film deposition apparatus of FIG. 1.

Referring to a subsection (a) of FIG. 4, the wafer receiving portion 24 and the wafer W placed in the wafer receiving portion 24 are illustrated. As shown in this drawing, the wafer receiving portion 24 has a diameter slightly larger, for example, by 4 mm than the diameter of the wafer W and a depth equal to a thickness of the wafer W. Therefore, when the wafer W is placed in the wafer receiving portion 24, a surface of the wafer W is at the same elevation of a surface of an area of the susceptor 2, the area excluding the wafer receiving portions 24. If there is a relatively large step between the area and the wafer W, gas flow turbulence is caused by the step, which may affect thickness uniformity across the wafer W. This is why the two surfaces are at the same elevation. While "the same elevation" may mean here that a height difference is less than or equal to about 5 mm, the difference has to be as close to zero as possible to the extent allowed by machining accuracy.

Figure 9:
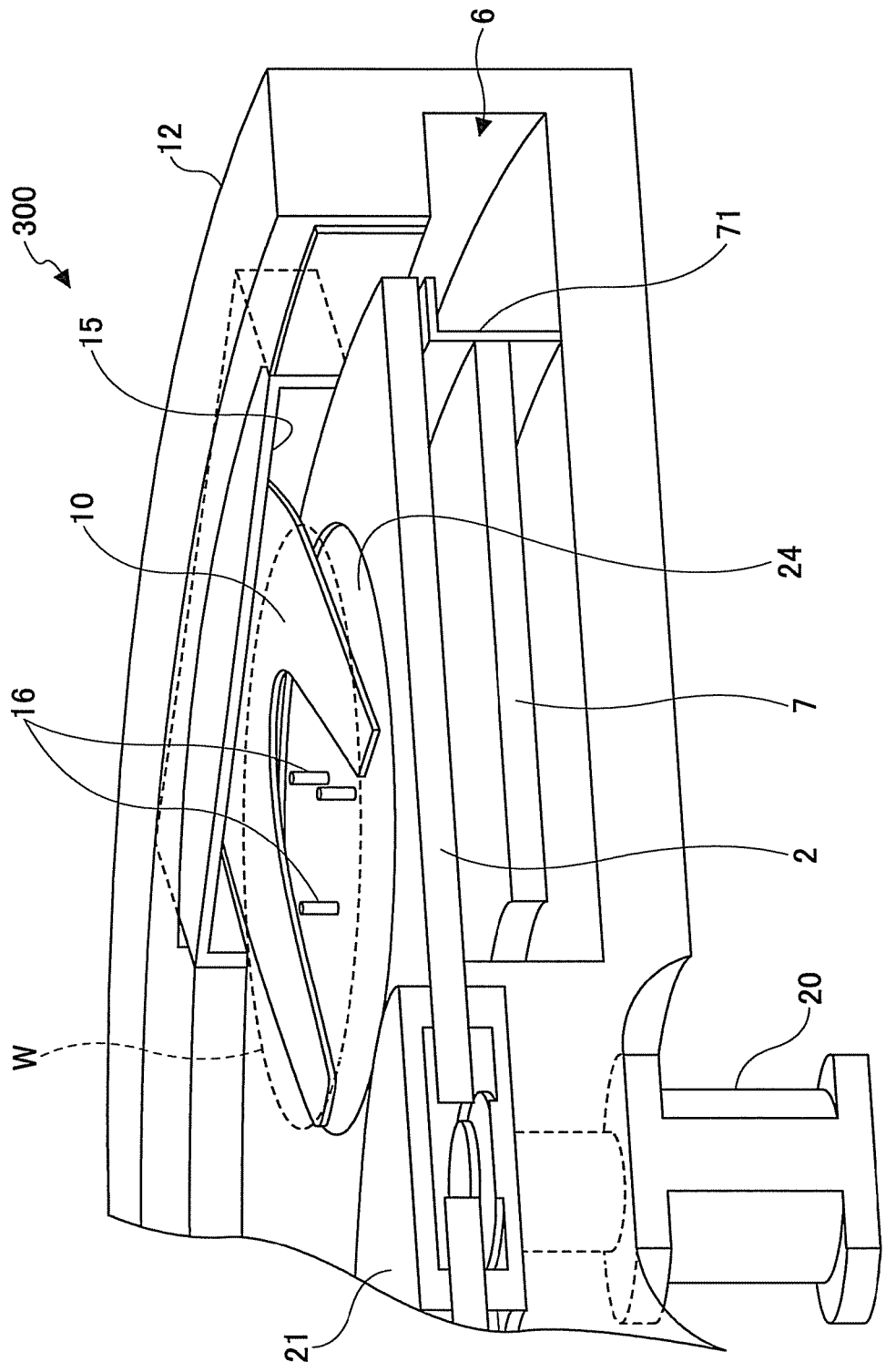
FIG. 9 is a perspective view illustrating a transfer arm entering an inside of a chamber of the film deposition apparatus of FIG. 7.

A transfer opening 15 is formed in a side wall of the chamber body 12 as shown in FIGS. 2, 3 and 9. Through the transfer opening 15, the wafer W is transferred into or out from the vacuum chamber 1 by a transfer arm 10 (FIG. 9). The transfer opening 15 is provided with a gate valve (not shown) by which the transfer opening 15 is opened or closed.

Referring again to FIGS. 2 and 3, a first reaction gas nozzle 31, a second reaction gas nozzle 32, and separation gas nozzles 41, 42 are provided above the susceptor 2. These gas nozzles 31, 32, 41, 42 extend in radial directions and at predetermined angular intervals. With this configuration, the wafer receiving portion 24 can move through and below the gas nozzles 31, 32, 41, and 42. In the illustrated example, the second reaction gas nozzle 32, the separation gas nozzle 41, the first reaction gas nozzle 31, and the separation gas nozzle 42 are arranged clockwise in this order. These gas nozzles 31, 32, 41, and 42 penetrate the circumferential wall portion of the chamber body 12 and are supported by attaching their base ends, which are gas inlet ports 31a, 32a, 41a, 42a, respectively, on the outer circumference of the wall portion. Although the gas nozzles 31, 32, 41, 42 are introduced into the vacuum chamber 1 from the circumferential wall portion of the vacuum chamber 1 in the illustrated example, these gas nozzles 31, 32, 41, 42 may be introduced from a ring-shaped protrusion portion 5 (described later). In this case, an L-shaped conduit may be provided in order to be open on the outer circumferential surface of the protrusion portion 5 and on the outer upper surface of the ceiling plate 11. With such an L-shaped conduit, the gas nozzle 31 (32, 41, 42) can be connected to one opening of the L-shaped conduit inside the vacuum chamber 1 and the gas inlet port 31a (32a, 41a, 42a) can be connected to the other opening of the L-shaped conduit outside the vacuum chamber 1.

Although not shown, the reaction gas nozzle 31 is connected to a gas supplying source of bis (tertiary-butylamino) silane (BTBAS), which is a first source gas, and the reaction gas nozzle 32 is connected to a gas supplying source of $O_3$ (ozone) gas, which is a second source gas.

The reaction gas nozzles 31, 32 have plural ejection holes 33 to eject the corresponding source gases downward. The plural ejection holes 33 are arranged in longitudinal directions of the reaction gas nozzles 31, 32 at predetermined intervals. The ejection holes 33 have an inner diameter of about 0.5 mm, and are arranged at intervals of about 10 mm in this embodiment. The reaction gas nozzles 31, 32 are a first reaction gas supplying portion and a second reaction gas supplying portion, respectively, in this embodiment. In addition, an area below the reaction gas nozzle 31 is a first process area P1 in which the BTBAS gas is adsorbed on the wafer W, and an area below the reaction gas nozzle 32 is a second process area P2 in which the $O_3$ gas is adsorbed on the wafer W.

On the other hand, the separation gas nozzles 41, 42 are connected to gas supplying sources of $N_2$ (nitrogen) gas (not shown). The separation gas nozzles 41, 42 have plural ejection holes 40 to eject the separation gases downward from the plural ejection holes 40. The plural ejection holes 40 are arranged at predetermined intervals in longitudinal directions of the separation gas nozzles 41, 42. The ejection holes have an inner diameter of about 0.5 mm, and are arranged at intervals of about 10 mm in this embodiment.

The separation gas nozzles 41, 42 are provided in separation areas D that are configured to separate the first process area P1 and the second process area P2. In each of the separation areas D, there is provided a convex portion 4 on the ceiling plate 11, as shown in FIGS. 2 through 4. The convex portion 4 has a top view shape of a sector whose apex lies at the center of the vacuum chamber 1 and whose arced periphery lies near and along the inner circumferential wall of the chamber body 12. In addition, the convex portion 4 has a groove portion 43 that extends in the radial direction as if the groove portion 43 substantially bisected the convex portion 4. The separation gas nozzle 41 (42) is housed in the groove portion 43. A circumferential distance between the center axis of the separation gas nozzle 41 (42) and one side of the sector-shaped convex portion 4 is substantially equal to the other circumferential distance between the center axis of the separation gas nozzle 41 (42) and the other side of the sector-shaped convex portion 4. Incidentally, while the groove portion 43 is formed in order to bisect the convex portion 4 in this embodiment, the groove portion 42 is formed so that an upstream side of the convex portion 4 relative to the rotation direction of the susceptor 2 is wider, in other embodiments.

With the above configuration, there are flat low ceiling surfaces 44 (first ceiling surfaces) on both sides of the separation gas nozzle 41 (42), and high ceiling surfaces 45 (second ceiling surfaces) outside of the corresponding low ceiling surfaces 44, as shown in a subsection (a) of FIG. 4. The convex portion 4 (ceiling surface 44) provides a separation space, which is a thin space, between the convex portion 4 and the susceptor 2 in order to impede the first and the second gases from entering the thin space and from being intermixed.

Referring to a subsection (b) of FIG. 4, the $O_3$ gas is impeded from entering the space between the convex portion 4 and the susceptor 2, the $O_3$ gas flowing toward the convex portion 4 from the reaction gas nozzle 32 along the rotation direction of the susceptor 2, and the BTBAS gas is impeded from entering the space between the convex portion 4 and the susceptor 2, the BTBAS gas flowing toward the convex portion 4 from the reaction gas nozzle 31 along the counter-rotation direction of the susceptor 2. "The gases being impeded from entering" means that the $N_2$ gas as the separation gas ejected from the separation gas nozzle 41 spreads between the first ceiling surfaces 44 and the upper surface of the susceptor 2 and flows out to a space below the second ceiling surfaces 45, which are adjacent to the corresponding first ceiling surfaces 44 in the illustrated example, so that the gases cannot enter the separation space from the space below the second ceiling surfaces 45. "The gases cannot enter the separation space" means not only that the gases are completely prevented from entering the separation space, but that the gases cannot proceed farther toward the separation gas nozzle 41 and thus be intermixed with each other even when a fraction of the reaction gases enter the separation space. Namely, as long as such an effect is demonstrated, the separation area D is to separate the first process area P1 and the second process area P2. Incidentally, the BTBAS gas or the $O_3$ gas adsorbed on the wafer W can pass through below the convex portion 4. Therefore, the gases in "the gases being impeded from entering" mean the gases in a gaseous phase.

Referring again to FIG. 1, a cleaning nozzle 60 is attached on the high ceiling surface 45 of the vacuum chamber 1. An opening 11a is made in the ceiling plate 11, and an evacuation pipe 60a of the cleaning nozzle 60 protrudes out from the vacuum chamber 1 through the opening 11a. Therefore, the evacuation pipe 60a can be seen in a subsection (a) of FIG. 5, which is a plan view of the vacuum chamber 1 (the ceiling plate 11). The evacuation pipe 60a is joined together to, for example, an evacuation pipe 63 (described later) and thus connected to a vacuum pump 64 (FIG. 1).

Figure 5:
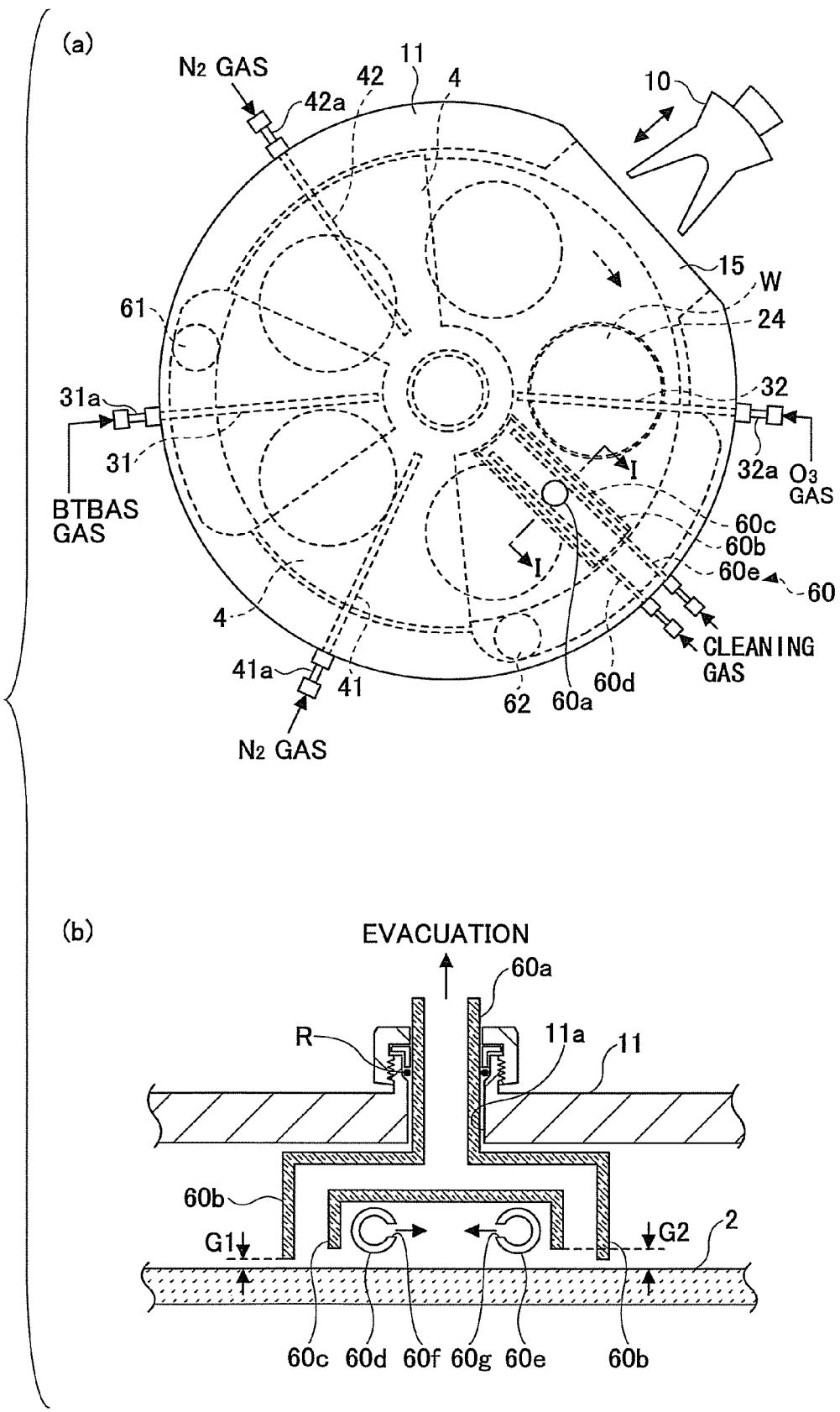
FIG. 5 is an explanatory view for explaining a cleaning gas provided in the film deposition apparatus of FIG. 1.

Referring to a subsection (b) of FIG. 5, which corresponds to a cross section taken along line I-I in the subsection (a) of FIG. 5, the cleaning nozzle 60 is explained. As shown, the evacuation pipe 60a is hermetically attached to the opening 11a of the ceiling plate 11 via a sealing member R such as an O ring. An outer hood member 60b is connected to a bottom end of the evacuation pipe 60a. The outer hood member 60b has an inverted concave shape and is open toward the susceptor 2, as shown in the subsection (b) of FIG. 5. In addition, the outer hood member 60b extends substantially along a radius direction of the susceptor 2 from the protrusion portion 5 (described later) through an outer circumferential edge of the susceptor 2, as shown in FIGS. 2 and 3. In other words, the outer hood member 60b has a shape obtained by removing a surface facing the susceptor 2 from a hollow parallelepiped extending from the protrusion portion 5 through the outer circumferential edge of the susceptor 2. The outer hood member 60b may be made of, for example, quartz and alumina.

As shown in the subsection (b) of FIG. 5, an inner hood member 60c is arranged inside the outer hood member 60b, leaving a space between the outer hood member 60b and the inner hood member 60c. The inner hood member 60c has an inverted concave shape and is open toward the susceptor 2, similar to the outer hood member 60b. In addition, the inner hood member 60c extends substantially along the radius direction of the susceptor 2. A length of the inner hood member 60c may be slightly shorter than or substantially equal to the length of the outer hood member 60b. The inner hood member 60c may be made of, for example, quartz.

Gas nozzles 60d, 60e are arranged in a space substantially defined by the inner hood member 60c and the upper surface of the susceptor 2. The gas nozzles 60d, 60e extend above and along the upper surface of the susceptor 2, along a longitudinal direction of the inner hood member 60c, and in parallel with each other. The gas nozzles 60d, 60e may be made of, for example, quartz. The gas nozzle 60d has plural holes 60f that are open toward the gas nozzle 60e and arranged along a longitudinal direction of the gas nozzle 60d. The gas nozzle 60e has plural holes 60g that are open toward the gas nozzle 60d and arranged along a longitudinal direction of the gas nozzle 60e. An inner diameter and intervals of the holes 60f, 60g may be about 0.5 mm and about 10 mm, respectively.

In addition, the gas nozzles 60d, 60e penetrate the circumferential wall portion of the chamber body 12 and are supported by attaching their base ends as gas inlet ports on the outer circumference of the chamber body 12, similar to the reaction gas nozzles 31, 32. In addition, the gas inlet ports of the gas nozzles 60d, 60e are connected to a predetermined gas supplying source (not shown). The gas supplying source has gas cylinders and the like storing predetermined cleaning gases, from which the cleaning gases are supplied to the gas nozzles 60*d*, 60*e*. Supplying lines connecting the gas supplying source and the gas nozzles 60*d*, 60*e* are provided with flow rate controllers such as mass flow controllers (MFC). With this, the cleaning gases are supplied to the gas nozzles 60*d*, 60*e* at controlled flow rates.

Incidentally, the cleaning gases may include a gas itself having reactivity (etching capability, or corrosivity) such as hydrogen fluoride gas, and a gas that does not have reactivity itself but generates a corrosive gas by being reacted with another gas.

In this embodiment of the present invention, the gas supplying source, the supplying lines, and the flow rate controllers are configured so that a fluorine ($F_2$) gas is supplied from the gas nozzle 60*d* and a hydrogen ($H_2$) gas is supplied from the gas nozzle 60*e*.

The advantages and effects of the cleaning nozzle 60 will be understood when a cleaning method using the cleaning nozzle 60 is explained below.

Referring to FIGS. 1, 2, and 3, a ring-shaped protrusion portion 5 is provided on a lower surface of the ceiling plate 11 so that the inner circumference of the protrusion portion 5 faces the outer circumference of the core portion 21. The protrusion portion 5 opposes the susceptor 2 at an outer area of the core portion 21. In addition, a lower surface of the protrusion portion 5 and a lower surface of the convex portion 4 form one plane surface. In other words, a height of the lower surface of the protrusion portion 5 from the susceptor 2 is the same as a height of the lower surface of the convex portion 4, which will be referred to as a height h below. Incidentally, the convex portion 4 is formed not integrally with but separately from the protrusion portion 5 in other embodiments. FIGS. 2 and 3 show the inner configuration of the vacuum chamber 1 whose top plate 11 is removed while the convex portions 4 remain inside the vacuum chamber 1.

The separation area D is configured by forming the groove portion 43 in a sector-shaped plate to be the convex portion 4, and locating the separation gas nozzle 41 (42) in the groove portion 43 in this embodiment. However, two sector-shaped plates may be attached on the lower surface of the ceiling plate 11 by screws so that the two sector-shaped plates are located on both sides of the separation gas nozzle 41 (32).

In this embodiment, when the wafer W having a diameter of about 300 mm is supposed to be processed in the vacuum chamber 1, the convex portion 4 has a circumferential length of, for example, about 146 mm along an inner arc li (FIG. 3) that is at a distance 140 mm from the rotation center of the susceptor 2, and a circumferential length of, for example, about 502 mm along an outer arc lo (FIG. 3) corresponding to the outermost portion of the wafer receiving portions 24 of the susceptor 2. In addition, a circumferential length from one side wall of the convex portion 4 through the nearest side wall of the groove portion 43 along the outer arc lo is about 246 mm.

In addition, the height h (the subsection (a) of FIG. 4) of the lower surface of the convex portion 4, or the ceiling surface 44, measured from the upper surface of the susceptor 2 (or the wafer W) is, for example, about 0.5 mm through about 10 mm, and preferably about 4 mm. In this case, the rotational speed of the susceptor 2 is, for example, 1 through 500 revolutions per minute (rpm). In order to ascertain the separation function performed by the separation area D, the size of the convex portion 4 and the height h of the ceiling surface 44 from the susceptor 2 may be determined depending on the pressure in the vacuum chamber 1 and the rotational speed of the susceptor 2 through experimentation. Incidentally, the separation gas is $N_2$ in this embodiment but may be an inert gas such as He and Ar, or $H_2$ in other embodiments, as long as the separation gas does not affect the deposition of a silicon oxide film.

Figure 6:
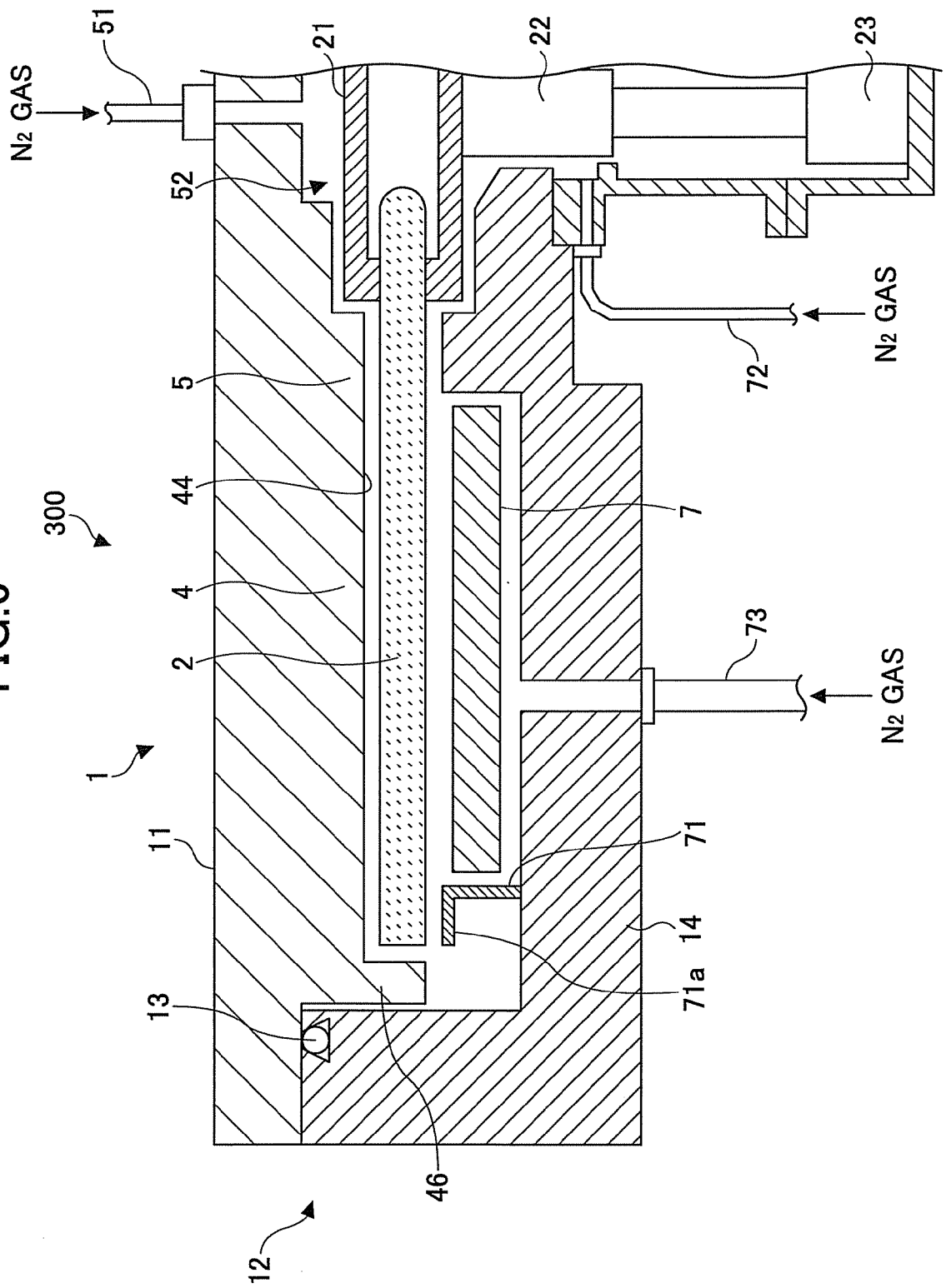
FIG. 6 is a partial cross-sectional view illustrating the film deposition apparatus of FIG. 1.

FIG. 6 shows a half portion of a cross-sectional view of the vacuum chamber 1, taken along line A-A in FIG. 3, where the convex portion 4 is shown along with the protrusion portion 5 formed integrally with the convex portion 4. Referring to FIG. 6, the convex portion 4 has a bent portion 46 that bends in an L-shape at the outer circumferential edge of the convex portion 4. Although there are slight gaps between the bent portion 46 and the susceptor 2 and between the bent portion 46 and the chamber body 12 because the convex portion 4 is attached on the lower surface of the ceiling portion 11 and removed from the chamber body 12 along with the ceiling portion 11, the bent portion 46 substantially fills out a space between the susceptor 2 and the chamber body 12, thereby preventing the first reaction gas (BTBAS) ejected from the first reaction gas nozzle 31 and the second reaction gas (ozone) ejected from the second reaction gas nozzle 32 from being intermixed through the space between the susceptor 2 and the chamber body 12. The gaps between the bent portion 46 and the susceptor 2 and between the bent portion 46 and the chamber body 12 may be the same as the height h of the ceiling surface 44 from the susceptor 2. In the illustrated example, a side wall facing the outer circumferential surface of the susceptor 2 serves as an inner circumferential wall of the separation area D.

Now, referring again to FIG. 1, which is a cross-sectional view taken along line B-B in FIG. 3, the chamber body 12 has an indented portion at the inner circumferential portion opposed to the outer circumferential surface of the susceptor 2. The indented portion is referred to as an evacuation area 6 hereinafter. Below the evacuation area 6, there is an evacuation port 61 (see FIG. 3 for another evacuation port 62) which is connected to a vacuum pump 64 via an evacuation pipe 63, which can also be used for the evacuation port 62. In addition, the evacuation pipe 63 is provided with a pressure controller 65. Plural pressure controllers 65 may be provided to the corresponding evacuation ports 61, 62.

Referring again to FIG. 3, the evacuation port 61 is located between the first reaction gas nozzle 31 and the convex portion 4 that is located downstream relative to the clockwise rotation direction of the susceptor 2 in relation to the first reaction gas nozzle 31, when viewed from above. With this configuration, the evacuation port 61 can substantially exclusively evacuate the BTBAS gas ejected from the reaction gas nozzle 31. On the other hand, the evacuation port 62 is located between the second reaction gas nozzle 32 and the convex portion 4 that is located downstream relative to the clockwise rotation direction of the susceptor 2 in relation to the second reaction gas nozzle 32, when viewed from above. With this configuration, the evacuation port 62 can substantially exclusively evacuate the $O_3$ gas ejected from the reaction gas nozzle 32. Therefore, the evacuation ports 61, 62 so configured may assist the separation areas D to prevent the BTBAS gas and the $O_3$ gas from being intermixed.

Although the two evacuation ports 61, 62 are made in the chamber body 12 in this embodiment, three evacuation ports may be provided in other embodiments. For example, an additional evacuation port may be made in an area between the second reaction gas nozzle 32 and the separation area D located upstream relative to the clockwise rotation of the susceptor 2 in relation to the second reaction gas nozzle 32. In addition, another additional evacuation port may be made at a predetermined position in the chamber body 12. While the evacuation ports 61, 62 are located below the susceptor 2 to evacuate the vacuum chamber 1 through an area between the inner circumferential wall of the chamber body 12 and the outer circumferential surface of the susceptor 2 in the illustrated example, the evacuation ports may be located in the side wall of the chamber body 12. In addition, when the evacuation ports 61, 62 are provided in the side wall of the chamber body 12, the evacuation ports 61, 62 may be located higher than the susceptor 2. In this case, the gases flow along the upper surface of the susceptor 2 into the evacuation ports 61, 62 located higher the susceptor 2. Therefore, it is advantageous in that particles in the vacuum chamber 1 are not blown upward by the gases, compared to when the evacuation ports are provided, for example, in the ceiling plate 11.

Figure 7:
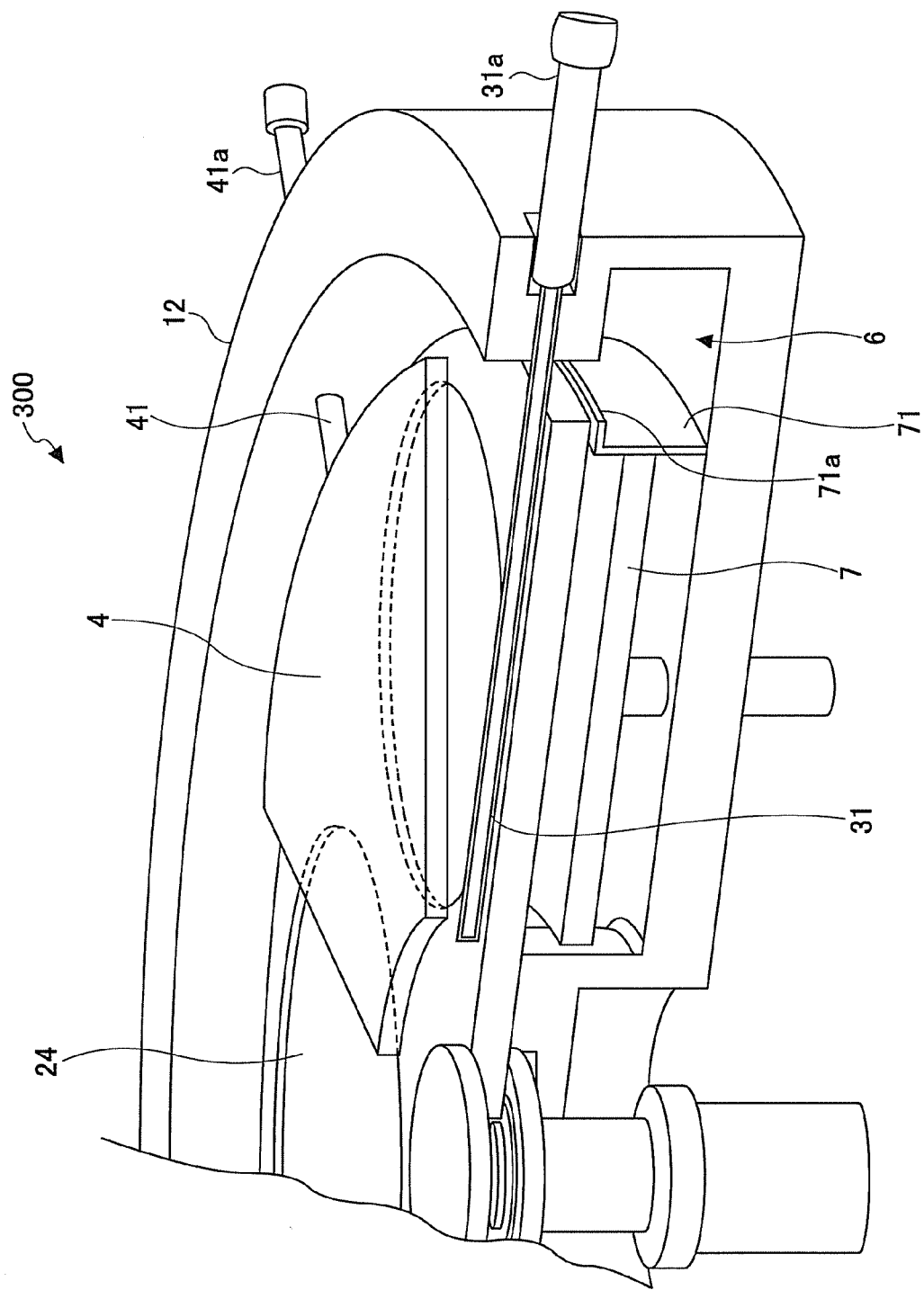
FIG. 7 is a broken perspective view illustrating the film deposition apparatus of FIG. 1.

As shown in FIGS. 1, 2, and 7, a ring-shaped heater unit 7 as a heating portion is provided in a space between the bottom portion 14 of the chamber body 12 and the susceptor 2, so that the wafers W placed on the susceptor 2 are heated through the susceptor 2 at a temperature determined by a process recipe. In addition, a cover member 71 is provided beneath the susceptor 2 and near the outer circumference of the susceptor 2 in order to surround the heater unit 7, so that the space where the heater unit 7 is located is partitioned from the outside area of the cover member 71. The cover member 71 has a flange portion 71a at the top. The flange portion 71a is arranged so that a slight gap is maintained between the lower surface of the susceptor 2 and the flange portion in order to prevent gas from flowing inside the cover member 71.

Referring back to FIG. 1, the bottom portion 14 of the chamber body 12 has a raised portion in an inside area of the ring-shaped heater unit 7. The upper surface of the raised portion comes close to the back surface of the susceptor 2 and the core portion 21, leaving slight gaps between the raised portion and the susceptor 2 and between the raised portion and the core portion 21. In addition, the bottom portion 14 has a center hole through which the rotational shaft 22 passes. The inner diameter of the center hole is slightly larger than the diameter of the rotational shaft 22, leaving a gap for gaseous communication with the case body 20 through the flanged pipe portion 20a. A purge gas supplying pipe 72 is connected to an upper portion of the flanged pipe portion 20a. In addition, plural purge gas supplying pipes 73 are connected at predetermined angular intervals to areas below the heater unit 7 in order to purge the space where the heater unit 7 is housed.

With these configurations, $N_2$ purge gas may flow from the purge gas supplying pipe 72 to the heater unit space through the gap between the rotational shaft 22 and the center hole of the bottom portion 14, the gap between the core portion 21 and the raised portion of the bottom portion 14, and the gap between the raised portion of the bottom portion 14 and the lower surface of the susceptor 2. In addition, $N_2$ purge gas may flow from the purge gas supplying pipes 73 to the space below the heater unit 7. Then, these $N_2$ purge gases flow into the evacuation port 61 through the gap between the flange portion 71a of the cover member 71 and the lower surface of the susceptor 2. These flows of the $N_2$ purge gas are schematically illustrated by arrows in FIG. 7. These $N_2$ purge gases serve as separation gases that prevent the first (second) reaction gas from flowing around the space below the susceptor 2 to be intermixed with the second (first) reaction gas.

Figure 8:
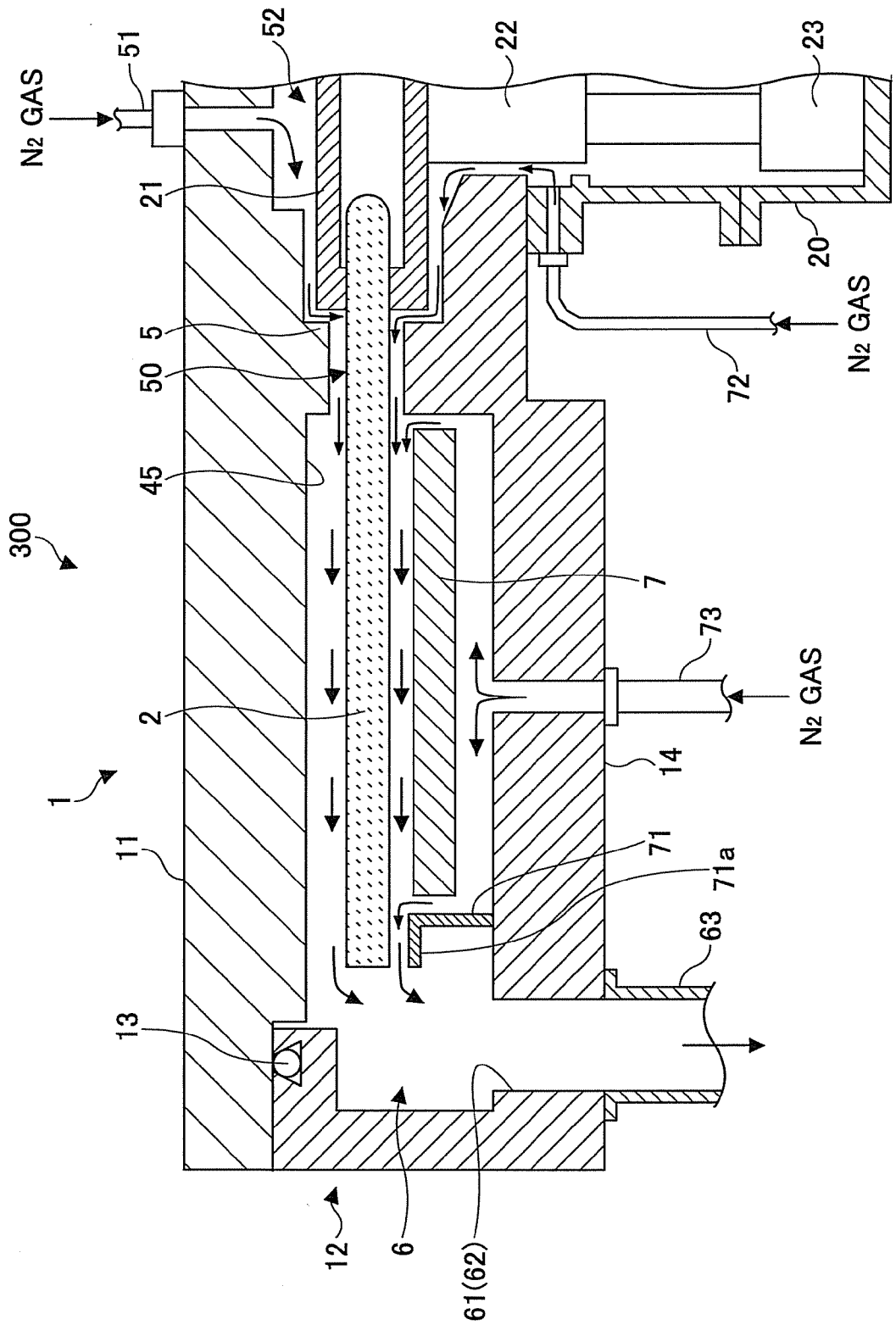
FIG. 8 is a partial cross-sectional view illustrating a flow of a purge gas in the film deposition apparatus of FIG. 1.

Referring to FIG. 8, a separation gas supplying pipe 51 is connected to the top center portion of the ceiling plate 11 of the vacuum chamber 1, so that $N_2$ gas is supplied as a separation gas to a space 52 between the ceiling plate 11 and the core portion 21. The separation gas supplied to the space 52 flows through the thin gap 50 between the protrusion portion 5 and the susceptor 2 and then along the upper surface of the susceptor 2, and reaches the evacuation area 6. Because the space 52 and the gap 50 are filled with the $N_2$ gas, the reaction gases (BTBAS, $O_3$) cannot be intermixed through the center portion of the susceptor 2. In other words, the film deposition apparatus according to this embodiment is provided with a center area C that is defined by the center portion of the susceptor 2 and the vacuum chamber 1 in order to isolate the first process area P1 and the second process area P2 and is configured to have an ejection opening that ejects the separation gas toward the upper surface of the susceptor 2. The ejection opening corresponds to the gap 50 between the protrusion portion 5 and the susceptor 2, in the illustrated example.

In addition, the film deposition apparatus 300 according to this embodiment is provided with a control portion 100 that controls total operations of the deposition apparatus 300. The control portion 100 includes a process controller 100a formed of, for example, a computer, a user interface portion 100b, and a memory device 100c. The user interface portion 100b has a display that shows operations of the film deposition apparatus, and a keyboard or a touch panel (not shown) that allows an operator of the film deposition apparatus 300 to select process recipes and an administrator of the film deposition apparatus to change parameters in the process recipes.

The memory device 100c stores a control program and a process recipe that cause the controlling portion 100 to carry out various operations of the deposition apparatus, and various parameters in the process recipe. These programs have groups of steps for carrying out the operations described later, for example. These programs are installed into and run by the process controller 100a by instructions from the user interface portion 100b. In addition, the programs are stored in a computer readable storage medium 100d and installed into the memory device 100c from the storage medium 100d through an input/output (I/O) device (not shown) corresponding to the computer readable storage medium 100d. The computer readable storage medium 100d may be a hard disk, a compact disc, a magneto optical disk, a memory card, a floppy disk, or the like. Moreover, the programs may be downloaded to the memory device 100c through a communications network.

Next, operations of the film deposition apparatus, or a film deposition method using the film deposition apparatus 300 according to this embodiment of the present invention are described. First, the susceptor 2 is rotated so that the wafer receiving portion 24 is in alignment with the transfer opening 15, and the gate valve (not shown) is open. Second, the wafer W is brought into the vacuum chamber 1 through the transfer opening 15 by the transfer arm 10. The wafer W is received by the elevation pins 16 and lowered to the wafer receiving portion 24 by the elevation pins 16 driven by the elevation mechanism (not shown) after the transfer arm 10 is pulled away from the vacuum chamber 1. Then, the series of operations above are repeated five times, and thus five wafers W are loaded on the susceptor 2. Next, the vacuum pump 64 (FIG. 1) is activated in order to maintain the vacuum chamber 1 at a predetermined reduced pressure. The susceptor 2 starts rotating clockwise when seen from above. The susceptor 2 is heated to a predetermined temperature (e.g., 300° C.) in advance by the heater unit 7, which in turn heats the wafers W on the susceptor 2. After the wafers W are heated and maintained at the predetermined temperature, which may be confirmed by a temperature sensor (not shown), the first reaction gas (BTBAS) is supplied to the first process area P1 through the first reaction gas nozzle 31, and the second reaction gas ($O_3$) is supplied to the second process area P2 through the second reaction gas nozzle 32. In addition, the separation gases ($N_2$) are supplied to the separation areas through the separation nozzles 41, 42.

When the wafer W passes through the first process area P1 below the first reaction gas nozzle 31, BTBAS molecules are adsorbed on the surface of the wafer W, and when the wafer W passes through the second process area P2 below the second reaction gas nozzle 32, $O_3$ molecules are adsorbed on the surface of the wafer W, so that the BTBAS molecules are oxidized by the $O_3$ molecules. Therefore, when the wafer W passes through both areas P1, P2 with one rotation of the susceptor 2, one molecular layer of silicon dioxide is formed on the surface of the wafer W. Then, the wafer W alternates passing through areas P1, P2 plural times, and a silicon dioxide layer having a predetermined thickness is formed on the surfaces of the wafers W. After the silicon dioxide film having the predetermined thickness is deposited, the supply of the BTBAS gas and the supply of the $O_3$ gas are stopped, and the rotation of the susceptor 2 is stopped. Then, the wafer W is taken out from the vacuum chamber 1 in a manner opposite to when the wafer W is transferred into the vacuum chamber 1.

In addition, during the deposition operations above, the $N_2$ gas as the separation gas is supplied from the separation gas supplying pipe 51, and is ejected toward the top surface of the susceptor 2 from the center area C, that is, the gap 50 between the protrusion portion 5 and the susceptor 2. In this embodiment, a space below the second ceiling surface 45, where the reaction gas nozzle 31 (32) is arranged, has a lower pressure than the center area C and the thin space between the first ceiling surface 44 and susceptor 2. This is because the evacuation area 6 is provided adjacent to the space below the ceiling surface 45 (see FIGS. 1 and 3) and the space is directly evacuated through the evacuation area 6. Additionally, it is partly because the thin space is provided so that the height h can maintain the pressure difference between the thin space and the place where the reaction gas nozzle 31 (32) or the first (the second) process area P1 (P2) is located.

Figure 10:
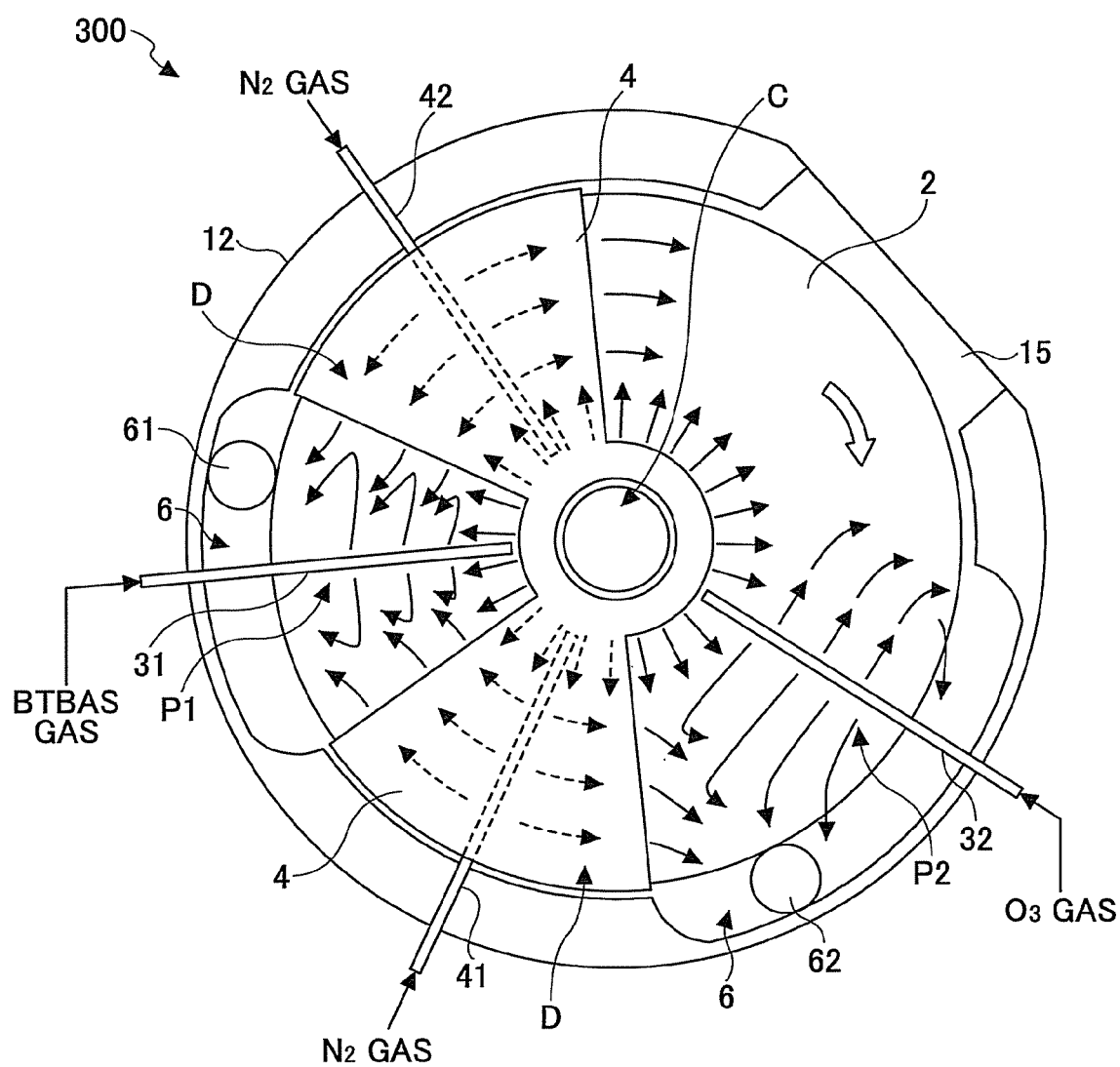
FIG. 10 is a plan view illustrating a gas flow pattern of gases flowing in the chamber of the film deposition apparatus of FIG. 1.

Next, the flow patterns of the gases supplied into the vacuum chamber 1 from the gas nozzles 31, 32, 41, 42 are described in reference to FIG. 10, which schematically shows the flow patterns. As shown, part of the $O_3$ gas ejected from the second reaction gas nozzle 32 hits and flows along the top surface of the susceptor 2 (and the surface of the wafer W) in a direction opposite to the rotation direction of the susceptor 2. Then, the $O_3$ gas is pushed back by the $N_2$ gas flowing along the rotation direction, and changes the flow direction toward the edge of the susceptor 2 and the inner circumferential wall of the chamber body 12. Finally, this part of the $O_3$ gas flows into the evacuation area 6 and is evacuated from the vacuum chamber 1 through the evacuation port 62.

Another part of the $O_3$ gas ejected from the second reaction gas nozzle 32 hits and flows along the top surface of the susceptor 2 (and the surface of the wafers W) in the same direction as the rotation direction of the susceptor 2. This part of the $O_3$ gas mainly flows toward the evacuation area 6 due to the $N_2$ gas flowing from the center portion C and suction force through the evacuation port 62. On the other hand, a small portion of this part of the $O_3$ gas flows toward the separation area D located downstream of the rotation direction of the susceptor 2 in relation to the second reaction gas nozzle 32 and may enter the gap between the ceiling surface 44 and the susceptor 2. However, because the height h of the gap is designed so that the $O_3$ gas is impeded from flowing into the gap at film deposition conditions intended, the small portion of the $O_3$ gas cannot flow into the gap. Even when a small fraction of the $O_3$ gas flows into the gap, the fraction of the $O_3$ gas cannot flow farther into the separation area D, because the fraction of the $O_3$ gas can be pushed backward by the $N_2$ gas ejected from the separation gas nozzle 41. Therefore, substantially all the part of the $O_3$ gas flowing along the top surface of the susceptor 2 in the rotation direction flows into the evacuation area 6 and is evacuated by the evacuation port 62, as shown in FIG. 10.

Similarly, part of the BTBAS gas ejected from the first reaction gas nozzle 31 to flow along the top surface of the susceptor 2 (and the surface of the wafers W) in a direction opposite to the rotation direction of the susceptor 2 is prevented from flowing into the gap between the susceptor 2 and the ceiling surface 44 of the convex portion 4 located upstream relative to the rotation direction of the susceptor 2 in relation to the first reaction gas supplying nozzle 31. Even if only a fraction of the BTBAS gas flows into the gap, this BTBAS gas is pushed backward by the $N_2$ gas ejected from the separation gas nozzle 41 in the separation area D. The BTBAS gas pushed backward flows toward the outer circumferential edge of the susceptor 2 and the inner circumferential wall of the chamber body 12, along with the $N_2$ gases from the separation gas nozzle 41 and the center portion C, and then is evacuated by the evacuation port 61 through the evacuation area 6.

Another part of the BTBAS gas ejected from the first reaction gas nozzle 31 to flow along the top surface of the susceptor 2 (and the surface of the wafers W) in the same direction as the rotation direction of the susceptor 2 cannot flow into the gap between the susceptor 2 and the ceiling surface 44 of the convex portion 4 located downstream relative to the rotation direction of the susceptor 2 in relation to the first reaction gas supplying nozzle 31. Even if a fraction of this part of the BTBAS gas flows into the gap, this BTBAS gas is pushed backward by the $N_2$ gases ejected from the center portion C and the separation gas nozzle 42 in the separation area D. The BTBAS gas pushed backward flows toward the evacuation area 6, along with the $N_2$ gases from the separation gas nozzle 41 and the center portion C, and then is evacuated by the evacuation port 61.

As stated above, the separation areas D may prevent the BTBAS gas and the $O_3$ gas from flowing thereinto, or may greatly reduce the amount of the BTBAS gas and the $O_3$ gas flowing thereinto, or may push the BTBAS gas and the $O_3$ gas backward. The BTBAS molecules and the $O_3$ molecules adsorbed on the wafer W are allowed to go through the separation area D, contributing to the film deposition.

Additionally, the BTBAS gas in the first process area P1 (the $O_3$ gas in the second process area P2) is prevented from flowing into the center area C, because the separation gas is ejected toward the outer circumferential edge of the susceptor 2 from the center area C, as shown in FIGS. 8 and 10. Even if a fraction of the BTBAS gas in the first process area P1 (the $O_3$ gas in the second process area P2) flows into the center area C, the BTBAS gas (the $O_3$ gas) is pushed backward, so that the BTBAS gas in the first process area P1 (the $O_3$ gas in the second process area P2) is prevented from flowing into the second process area P2 (the first process area P1) through the center area C.

Moreover, the BTBAS gas in the first process area P1 (the $O_3$ gas in the second process area P2) is prevented from flowing into the second process area P2 (the first process area P1) through the space between the susceptor 2 and the inner circumferential wall of the chamber body 12. This is because the bent portion 46 is formed downward from the convex portion 4 so that the gaps between the bent portion 46 and the susceptor 2 and between the bent portion 46 and the inner circumferential wall of the chamber body 12 are as small as the height h of the ceiling surface 44 of the convex portion 4, the height being measured from the susceptor 2, thereby substantially avoiding pressure communication between the two process areas, as stated above. Therefore, the BTBAS gas is evacuated from the evacuation port 61, and the $O_3$ gas is evacuated from the evacuation port 62, and thus the two reaction gases are not mixed. In addition, the space below the susceptor 2 is purged by the $N_2$ gas supplied from the purge gas supplying pipes 72, 73. Therefore, the BTBAS gas cannot flow through below the susceptor 2 into the second process area 22.

An example of process parameters preferable in the film deposition apparatus according to this embodiment is listed below.

rotational speed of the susceptor 2: 1-500 rpm (in the case of the wafer W having a diameter of 300 mm)
pressure in the vacuum chamber 1: 1067 Pa (8 Torr)
wafer temperature: 350° C.
flow rate of BTBAS gas: 100 sccm
flow rate of $O_3$ gas: 10000 sccm
flow rate of $N_2$ gas from the separation gas nozzles 41, 42: 20000 sccm
flow rate of $N_2$ gas from the separation gas supplying pipe 51: 5000 sccm
the number of rotations of the susceptor 2: 600 rotations (depending on the film thickness required)

According to the film deposition apparatus 300 of this embodiment, because the film deposition apparatus 300 has the separation areas D including the low ceiling surface 44 between the first process area P1, to which the BTBAS gas is supplied from the first reaction gas nozzle 31, and the second process area P2, to which the $O_3$ gas is supplied from the second reaction gas nozzle 32, the BTBAS gas (the $O_3$ gas) is prevented from flowing into the second process area P2 (the first process area P1) and being mixed with the $O_3$ gas (the BTBAS gas). Therefore, an MLD (or ALD) mode deposition of silicon dioxide is assuredly performed by rotating the susceptor 2 on which the wafers W are placed in order to allow the wafers W to pass through the first process area P1, the separation area D, the second process area P2, and the separation area D. In addition, the separation areas D further include the separation gas nozzles 41, 42 from which the $N_2$ gases are ejected in order to further assuredly prevent the BTBAS gas (the $O_3$ gas) from flowing into the second process area P2 (the first process area P1) and being mixed with the $O_3$ gas (the BTBAS gas). Moreover, because the vacuum chamber 1 of the film deposition apparatus according to this embodiment has the center area C having the ejection holes from which the $N_2$ gas is ejected, the BTBAS gas (the $O_3$ gas) is prevented from flowing into the second process area P2 (the first process area P1) through the center area C and being mixed with the $O_3$ gas (the BTBAS gas). Furthermore, because the BTBAS gas and the $O_3$ gas are not mixed, almost no deposits of silicon dioxide are made on the susceptor 2, thereby reducing particle problems.

As explained above, in the film deposition apparatus 300 according to this embodiment of the present invention, the reaction gases are rarely reacted with each other in a gaseous phase, and thus deposition of the film onto the inner surface of the vacuum chamber 1 can be prevented as much as possible. However, gas molecules of the first reaction gas (e.g., BTBAS gas) can be adsorbed on the susceptor 2 in the first process area P1, and gas molecules of the second reaction gas (e.g., $O_3$ gas) can be adsorbed on the susceptor 2 in the second area P2, when the susceptor 2 is rotated. Therefore, a reaction product (e.g., silicon oxide) of the first and the second reaction gases is deposited on the susceptor 2. When a thickness of the reaction product deposited on the susceptor 2 exceeds a certain thickness, the reaction product is peeled off, thereby generating particles. However, the film deposition apparatus 300 according to this embodiment of the present invention is provided with the cleaning nozzle 60, with which the reaction product deposited on the susceptor 2 can be removed. In the following, a cleaning method of removing silicon oxide deposits on the susceptor 2 by use of the cleaning nozzle 2 is explained. This cleaning method may be carried out after every run of film deposition, or after the predetermined number of runs. In addition, this cleaning method is carried out by executing in the process controller 100a a program for this cleaning method, which is stored in the memory apparatus 100c and includes group of steps for causing various components and parts of the film deposition apparatus 300 to operate.

First, $N_2$ gases are supplied from the separation gas nozzles 41, 42, and the inside of the vacuum chamber 1 is maintained at a predetermined pressure by the vacuum pump 64 and the pressure controller 65. The pressure may be 133.3 Pa through 50 kPa, for example.

Next, the susceptor 2 is rotated. The rotational speed may be determined taking into consideration a thickness of the silicon oxide deposits on the susceptor 2, a removal rate (etching rate) of the silicon oxide deposits, a concentration of the cleaning gas and the like. Specifically, the rotational speed may be 10 revolutions per minute (rpm). In addition, the susceptor 2 may be heated to a predetermined temperature, depending on the cleaning gas used.

Then, while the inner space of the cleaning nozzle 60 is evacuated through the evacuation pipe 60a of the cleaning nozzle 60, $F_2$ gas and $H_2$ gas are supplied to the inner space of the inner hood member 60c through the gas nozzles 60d and 60e, respectively, from the gas supplying source (not shown). These gases are reacted with each other in the inner space, which has an inverted concave shape, of the inner hood member 60c, and thus hydrofluoric acid (HF) is produced. The silicon oxide deposits on the susceptor 2 are decomposed and removed by the HF. In addition, a reaction product of the silicon oxide and the HF, unreacted HF, $H_2$, and $F_2$ are evacuated through the space (gas passage) between the inner hood member 60c and the outer hood member 60b from the evacuation pipe 60a. The $N_2$ gas can be flowed into the gas passage, even if slightly, from outside spaces of the outer hood member 60b because of evacuation through the evacuation pipe 60a. Therefore, the reactive gases such as HF and $F_2$ are not likely to spread out to the inner space of the vacuum chamber 1. Incidentally, the inner pressure of the vacuum chamber 1 is preferably set as relatively higher, because the cleaning gases are effectively prevented from spreading out to the outside spaces of the outer hood member 60c. In other words, the inner pressure of the cleaning nozzle 60 through the evacuation pipe 60a is preferably adjusted to be lower than the inner pressure of the vacuum chamber 1.

After a predetermined period of time (cleaning time) has elapsed, the supply of the gases from the gas nozzles 60d, 60e is stopped, and the vacuum chamber 1 is purged, which can be carried out, for example, by keeping supplying the $N_2$ gases from the separation gas nozzles 41, 42 for a predetermined period of time. After the purging the vacuum chamber 1 is completed, the rotation of the susceptor 2 is stopped, the supply of the $N_2$ gases is stopped, and thus the cleaning method is completed.

As stated above, the film deposition apparatus 300 according to this embodiment of the present invention is provided with the cleaning nozzle 60 adjacently above the upper surface of the susceptor 2 and the cleaning gas(es) is supplied to the upper surface of the susceptor 2, thereby removing the deposits on the susceptor 2. Because the deposits on the susceptor 2 can be removed without disassembling the vacuum chamber 1, a turn-around-time (TAT) can be reduced.

In addition, the cleaning nozzle 60 is configured such that the cleaning gases supplied from the gas nozzles 60d, 60e reach the upper surface of the susceptor 2 and are evacuated through the gas passage open on both sides of the inner space of the inner hood member 60c, which is defined by the inner hood member 60b and the upper surface of the susceptor 2, where the gas nozzles 60d, 60e extend. Therefore, the cleaning gases are prevented from spreading out to the inner space of the vacuum chamber 1. Therefore, it is possible to circumvent a problem in that the inner surface of the vacuum chamber 1, which may be made of a metal such as aluminum, is corroded by the cleaning gas(es). If the cleaning nozzle 60 is absent, because the cleaning gas(es) can spread throughout the inside of the vacuum chamber 1, measures for protecting the inner surface of the vacuum chamber 1 are required. However, according to the cleaning nozzle 60, such measures are unnecessary, thereby reducing a maintenance cost. Moreover, because the cleaning gas(es) can remain inside the space defined by the inner hood member 60c and the upper surface of the susceptor 2, a concentration of the cleaning gas(es) can be relatively higher, which enhances cleaning efficiency, thereby contributing an improvement of the production throughput through a reduction of time required for the cleaning.

Here, the cleaning nozzle 60 is further explained mainly referring the subsection (b) of FIG. 5 in the following. A height of the gap G1 between an opening end portion of the outer hood member 60b and the upper surface of the susceptor 2 is preferably in a range from about 1 mm through about 4 mm. If the height is more than about 4 mm, the cleaning gas(es) supplied from the gas nozzles 60d, 60e are not likely to be evacuated from the gas passage between the outer hood member 60b and the inner hood member 60c and are likely spread out to the inner space of the vacuum chamber 1 through the gap G1. On the other hand, if the height is less than about 1 mm, the outer hood member 60b is likely to hit the susceptor 2, thereby generating particles.

In addition, a clearance between the outer hood member 60b and the inner hood member 60c, or a width of the space formed between the hood members 60b, 60c (or the gas passage), is preferably in a range from about 5 mm through about 10 mm. Moreover, a height of a gap G2 between the inner hood member 60c and the upper surface of the susceptor 2 (the subsection (b) of FIG. 5) may be in a range from about 2 mm through about 5 mm. Furthermore, the height of the gap G2 is preferably greater than the height of the gap G1 in order to facilitate the cleaning gas(es) flowing into the gas passage.

Incidentally, although the susceptor 2 has the five wafer receiving portions 24 and five wafers W placed in the corresponding wafer receiving portions 24 can be processed in one run in this embodiment, only one wafer W is placed in one of the five wafer receiving portions 24, or the susceptor 2 may have only one wafer receiving portion 24, in other embodiments.

In addition, not being limited to MLD of a silicon oxide film, the film deposition apparatus 300 is used to carry out MLD of a silicon nitride film. As a nitriding gas in the case of MLD of silicon nitride, ammonia ($NH_3$), hydrazine ($N_2H_2$), and the like are used.

In addition, as a source gas for the silicon oxide or nitride film deposition, dichlorosilane (DCS), hexadichlorosilane (HCD, tris(dimethylamino)silane (3DMAS), tetra ethyl ortho silicate (TEOS), and the like may be used rather than BTBAS.

Moreover, the film deposition apparatus according to an embodiment of the present invention may be used for MLD of an aluminum oxide ($Al_2O_3$) film using trymethylaluminum (TMA) and $O_3$ or oxygen plasma, a zirconium oxide ($ZrO_2$) film using tetrakis(ethylmethylamino)zirconium (TEMAZ) and $O_3$ or oxygen plasma, a hafnium oxide ($HfO_2$) film using tetrakis(ethylmethylamino)hafnium (TEMAHf) and $O_3$ or oxygen plasma, a strontium oxide (SrO) film using bis(tetra methyl heptandionate) strontium ($Sr(THD)_2$) and $O_3$ or oxygen plasma, a titanium oxide (TiO) film using (methyl-pentadionate)(bis-tetra-methyl-heptandionate) titanium (Ti(MP-D)(THD)) and $O_3$ or oxygen plasma, and the like, rather than the silicon oxide film and the silicon nitride film.

Figure 11:
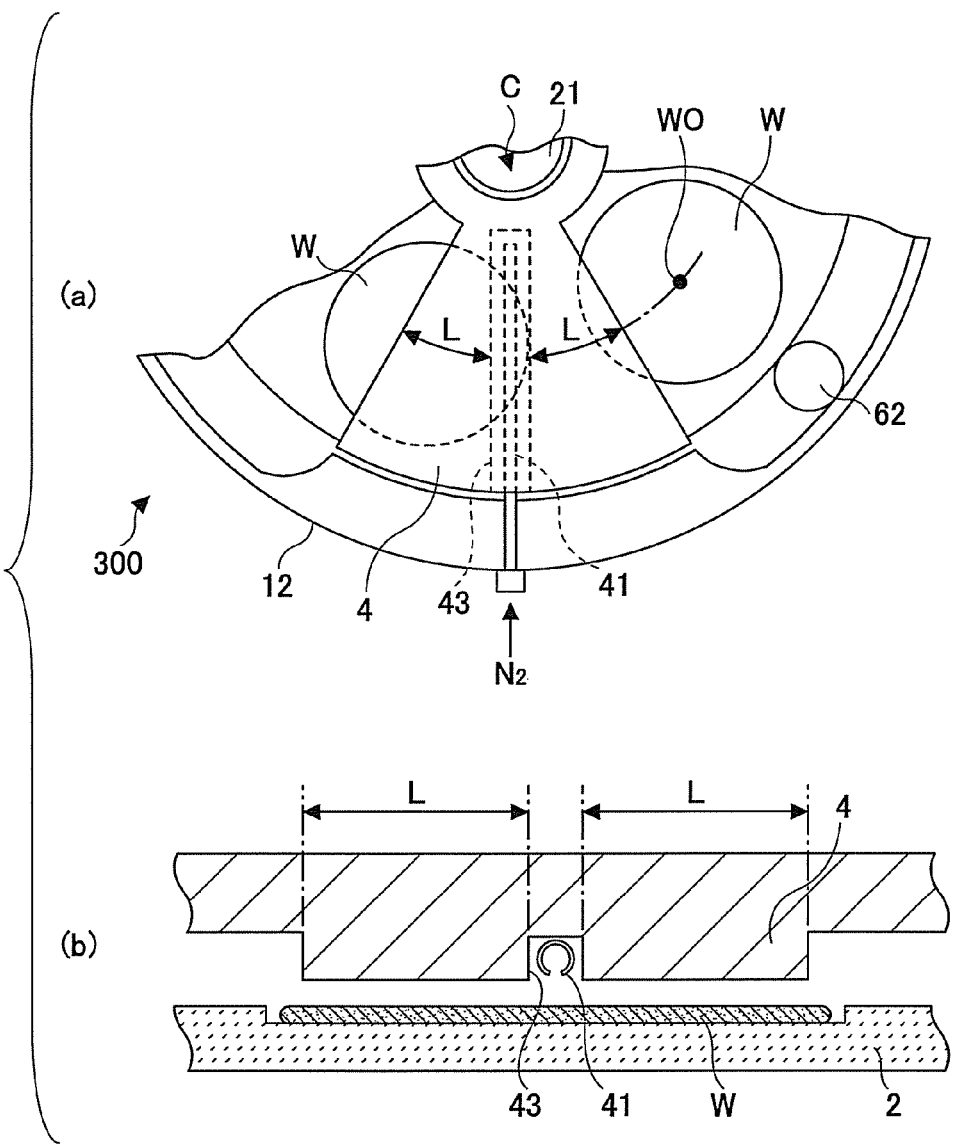
FIG. 11 is an explanatory view for explaining the convex portion of the film deposition apparatus of FIG. 1.

The size of the convex portion 4 (or the ceiling surface 44) is exemplified again below. Referring to subsections (a) and (b) of FIG. 11, the ceiling surface 44 that creates the thin space in both sides of the separation gas nozzle 41 (42) may preferably have a length L ranging from about one-tenth of a diameter of the wafer W through about a diameter of the wafer W, preferably, about one-sixth or more of the diameter of the wafer W along an arc that corresponds to a route through which a wafer center WO passes. Specifically, the length L is preferably about 50 mm or more when the wafer W has a diameter of 300 mm. When the length L is small, the height h of the thin space between the ceiling surface 44 and the susceptor 2 (wafer W) has to be accordingly small in order to effectively prevent the reaction gases from flowing into the thin space. However, when the length L becomes too small and thus the height h has to be extremely small, the susceptor 2 may hit the ceiling surface 44, which may cause wafer breakage and wafer contamination through particle generation. Therefore, measures to damp vibration of the susceptor 2 or measures to stably rotate the susceptor 2 are required in order to avoid the susceptor 2 hitting the ceiling surface 44. On the other hand, when the height h of the thin space is kept relatively greater while the length L is small, a rotational speed of the susceptor 2 has to be lower in order to avoid the reaction gases flowing into the thin gap between the ceiling surface 44 and the susceptor 2, which is rather disadvantageous in terms of production throughput. From these considerations, the length L of the ceiling surface 44 along the arc corresponding to the route of the wafer center WO is preferably about 50 mm or more. However, the size of the convex portion 4 or the ceiling surface 44 is not limited to the above size, but may be adjusted depending on the process parameters and the size of the wafer to be used. In addition, as clearly understood from the above explanation, the height h of the thin space may be adjusted depending on an area of the ceiling surface 44 in addition to the process parameters and the size of the wafer to be used, as long as the thin space has a height that allows the separation gas to flow from the separation area D through the process area P1 (P2).

Figure 12:
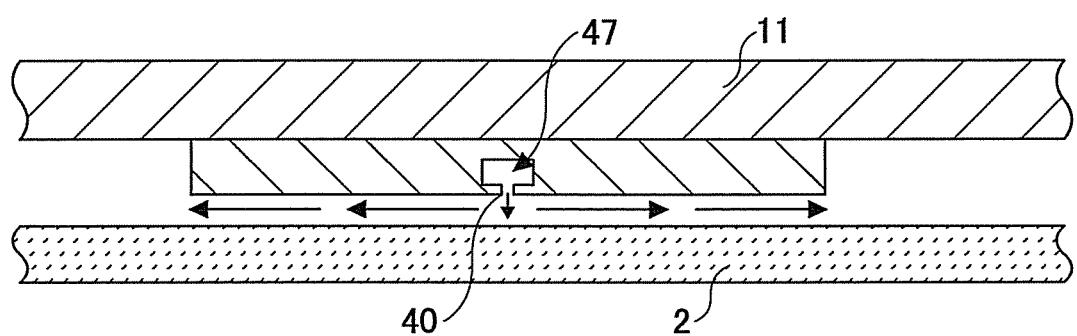
FIG. 12 illustrates a modification example of the gas supplying nozzle of the film deposition apparatus of FIG. 1.

The separation gas nozzle 41 (42) is located in the groove portion 43 formed in the convex portion 4 and the lower ceiling surfaces 44 are located in both sides of the separation gas nozzle 41 (42) in the above embodiment. However, as shown in FIG. 12, a conduit 47 extending along the radial direction of the susceptor 2 may be made inside the convex portion 4, instead of the separation gas nozzle 41 (42), and plural holes 40 may be formed along the longitudinal direction of the conduit 47 so that the separation gas ($N_2$ gas) may be ejected from the plural holes 40 in other embodiments.

Figure 13:
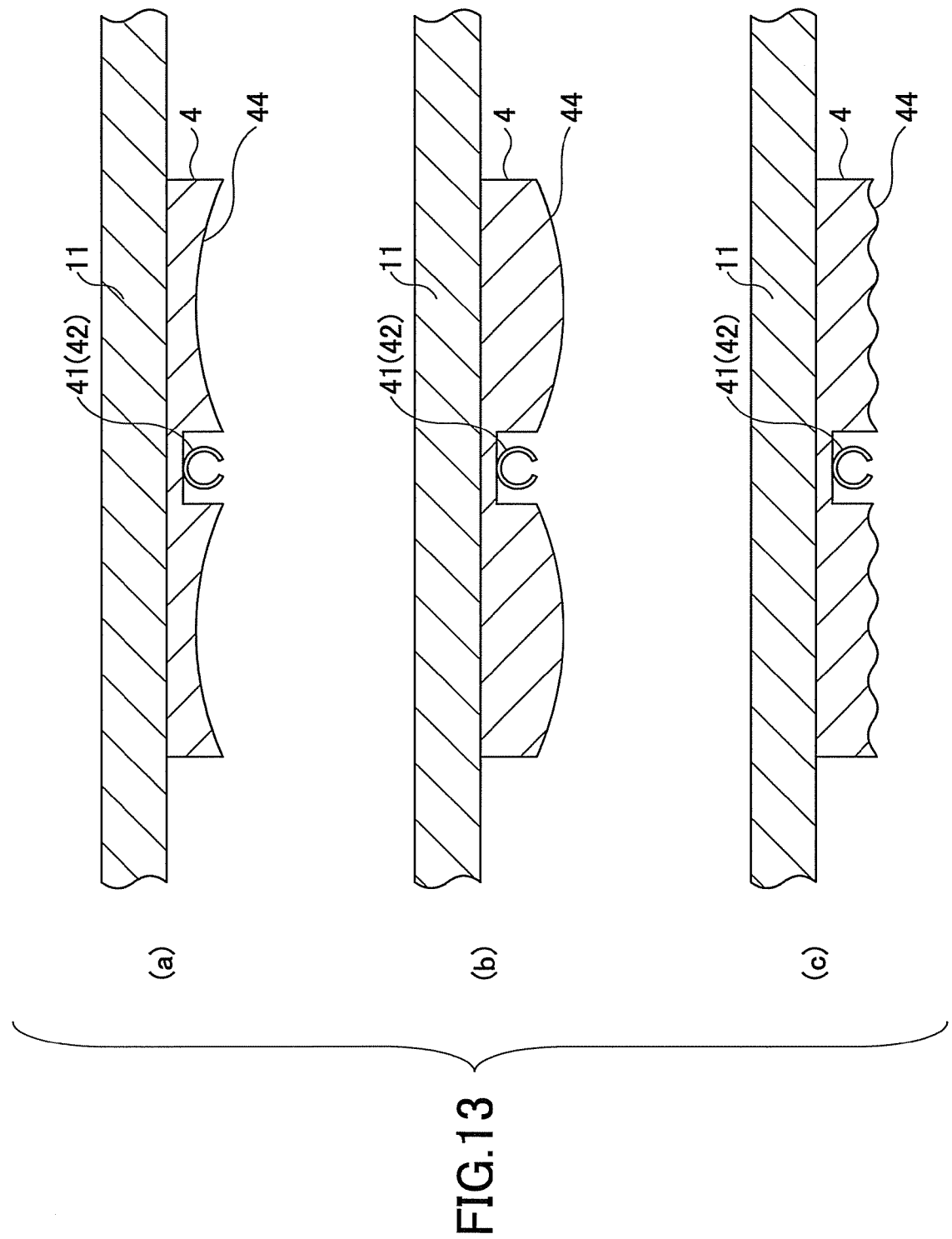
FIG. 13 illustrates modification examples of the convex portion of the film deposition apparatus of FIG. 1.

The ceiling surface 44 of the separation area D is not necessarily flat in other embodiments. For example, the ceiling surface 44 may be concavely curved as shown in a subsection (a) of FIG. 13, convexly curved as shown in a subsection (b) of FIG. 13, or corrugated as shown in a subsection (c) of FIG. 13.

In addition, the convex portion 4 may be hollow and the separation gas may be introduced into the hollow convex portion 4. In this case, the plural gas ejection holes 33 may be arranged as shown in subsections (a) through (c) of FIG. 14.

Figure 14:
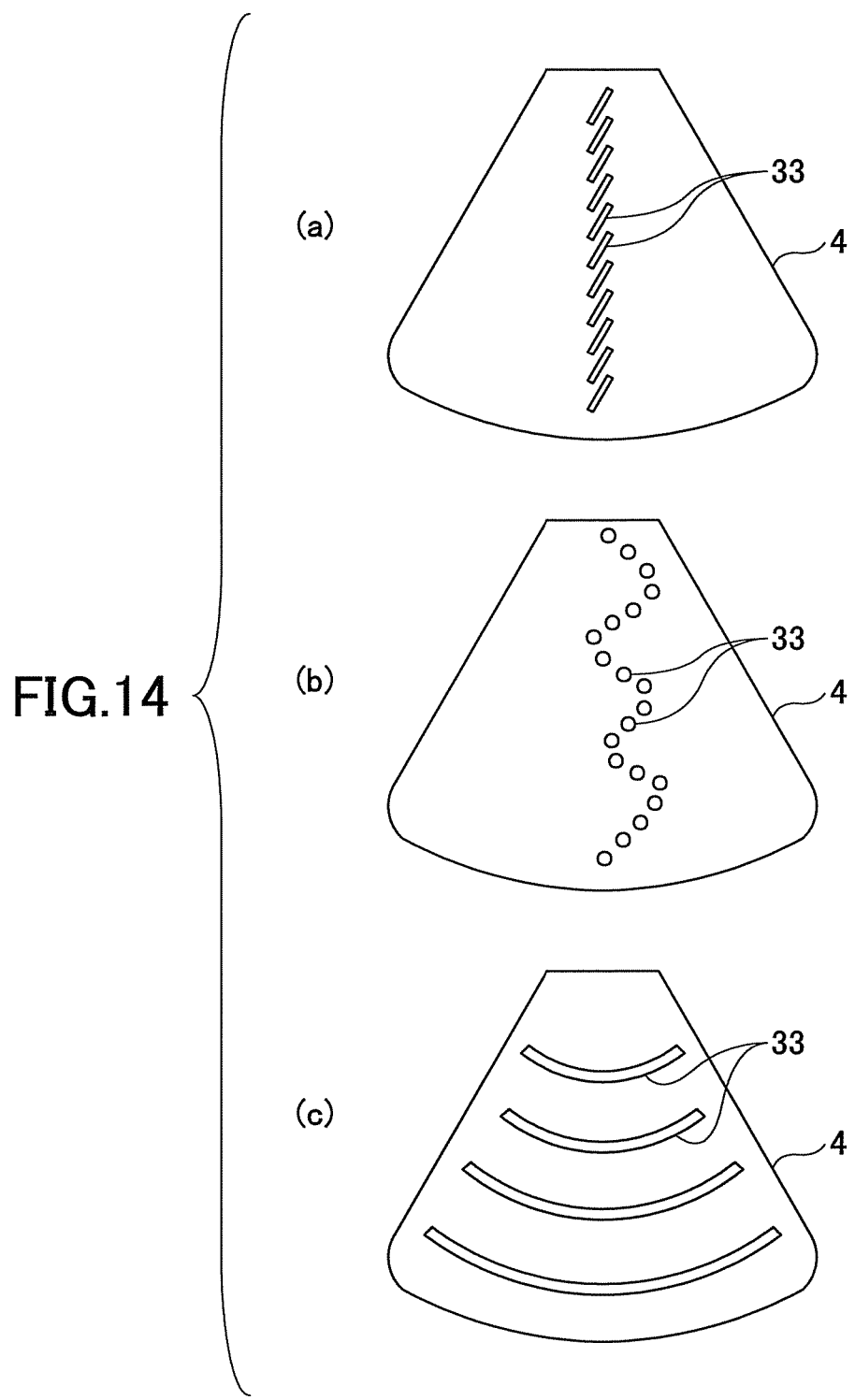
FIG. 14 illustrates modification examples of the convex portion and the gas supplying nozzle of the film deposition apparatus of FIG. 1.

Referring to the subsection (a) of FIG. 14, each of the plural gas ejection holes 33 has a shape of a slanted slit. These slanted slits (gas ejection holes 33) are arranged to be partially overlapped with an adjacent slit along the radial direction of the susceptor 2. In the subsection (b) of FIG. 14, the plural gas ejection holes 33 are circular. These circular holes (gas ejection holes 33) are arranged along a serpentine line that extends in the radial direction as a whole. In the subsection (c) of FIG. 14, each of the plural gas ejection holes 33 has the shape of an arc-shaped slit. These arc-shaped slits (gas ejection holes 33) are arranged at predetermined intervals in the radial direction.

Figure 15:
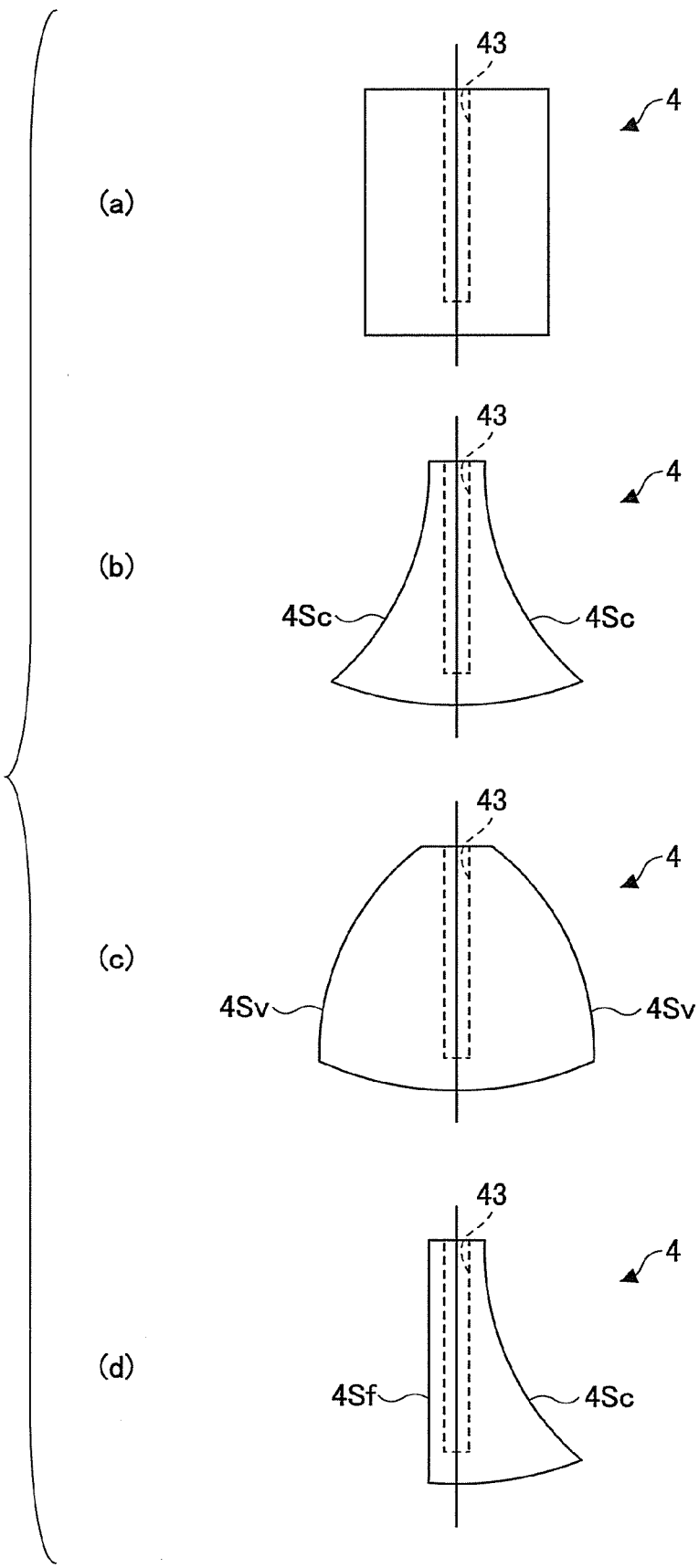
FIG. 15 illustrates other examples of the convex portion of the film deposition apparatus of FIG. 1.

While the convex portion 4 has the sector-shaped top view shape in this embodiment, the convex portion 4 may have a rectangle top view shape as shown in a subsection (a) of FIG. 15, or a square top view shape in other embodiments. Alternatively, the convex portion 4 may be sector-shaped as a whole in the top view and have concavely curved side surfaces 4Sc, as shown in a subsection (b) of FIG. 15. In addition, the convex portion 4 may be sector-shaped as a whole in the top view and have convexly curved side surfaces 4Sv, as shown in a subsection (c) of FIG. 15. Moreover, an upstream portion of the convex portion 4 relative to the rotation direction of the susceptor 2 (FIG. 1) may have a concavely curved side surface 4Sc and a downstream portion of the convex portion 4 relative to the rotation direction of the susceptor 2 (FIG. 1) may have a flat side surface 4Sf, as shown in a subsection (d) of FIG. 15. Incidentally, dotted lines in the subsections (a) through (d) of FIG. 15 represent the groove portions 43. In these cases, the separation gas nozzle 41 (42), which is housed in the groove portion 43, extends from the center portion of the vacuum chamber 1, for example, from the protrusion portion 5.

The heater unit 7 for heating the wafers W is configured to have a lamp heating element instead of the resistance heating element. In addition, the heater unit 7 may be located above the susceptor 2, or above and below the susceptor 2.

Figure 16:
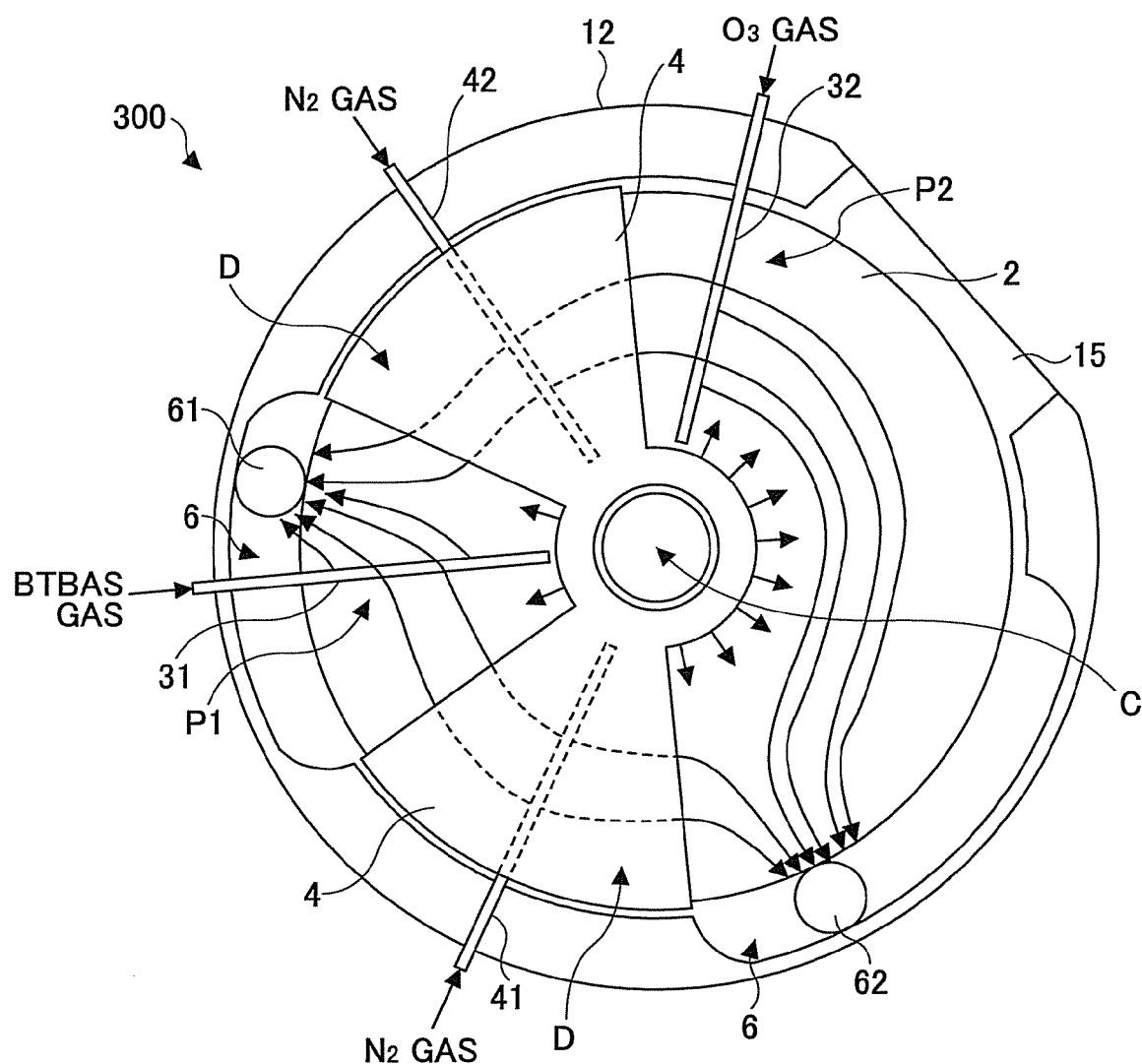
FIG. 16 illustrates a modification example of the gas supplying nozzle in the film deposition apparatus of FIG. 1.
Figure 17:
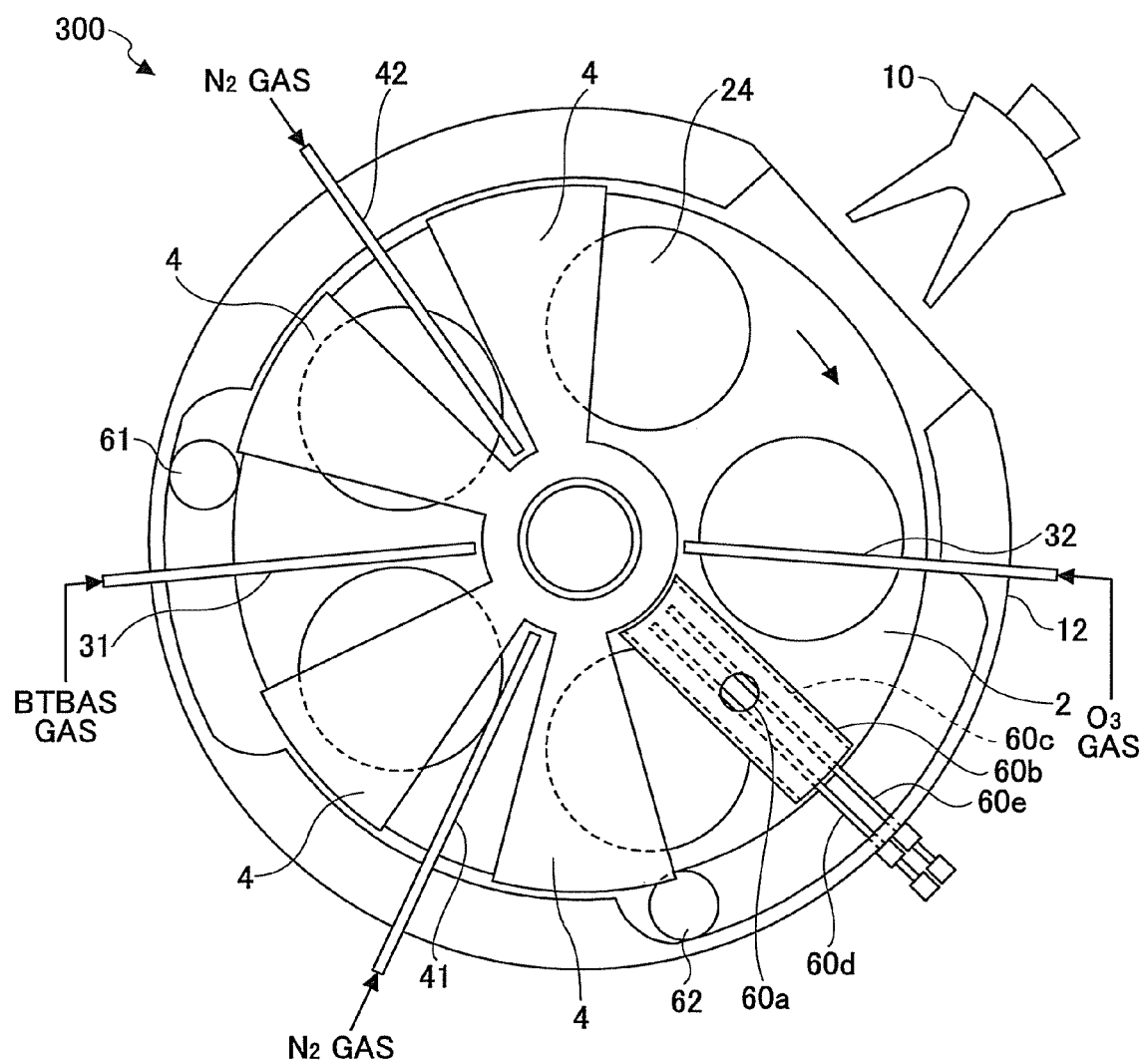
FIG. 17 illustrates another modification example of the convex portion of the film deposition apparatus of FIG. 1.

The process areas P1, P2 and the separation area D may be arranged as shown in FIG. 16, in other embodiments. Referring to FIG. 16, the second reaction gas nozzle 32 for supplying the second reaction gas (e.g., $O_3$ gas) is located upstream in the rotation direction relative to the transfer opening 15, or between the separation gas nozzle 42 and the transfer opening 15. Even in such an arrangement, the gases ejected from the nozzle 31, 32, 41, 42 and the center area C flow generally along arrows shown in FIG. 16, so that the first reaction gas and the second reaction gas cannot be intermixed. Therefore, a proper MLD (or ALD) mode film deposition can be realized by such an arrangement.

Figure 19:
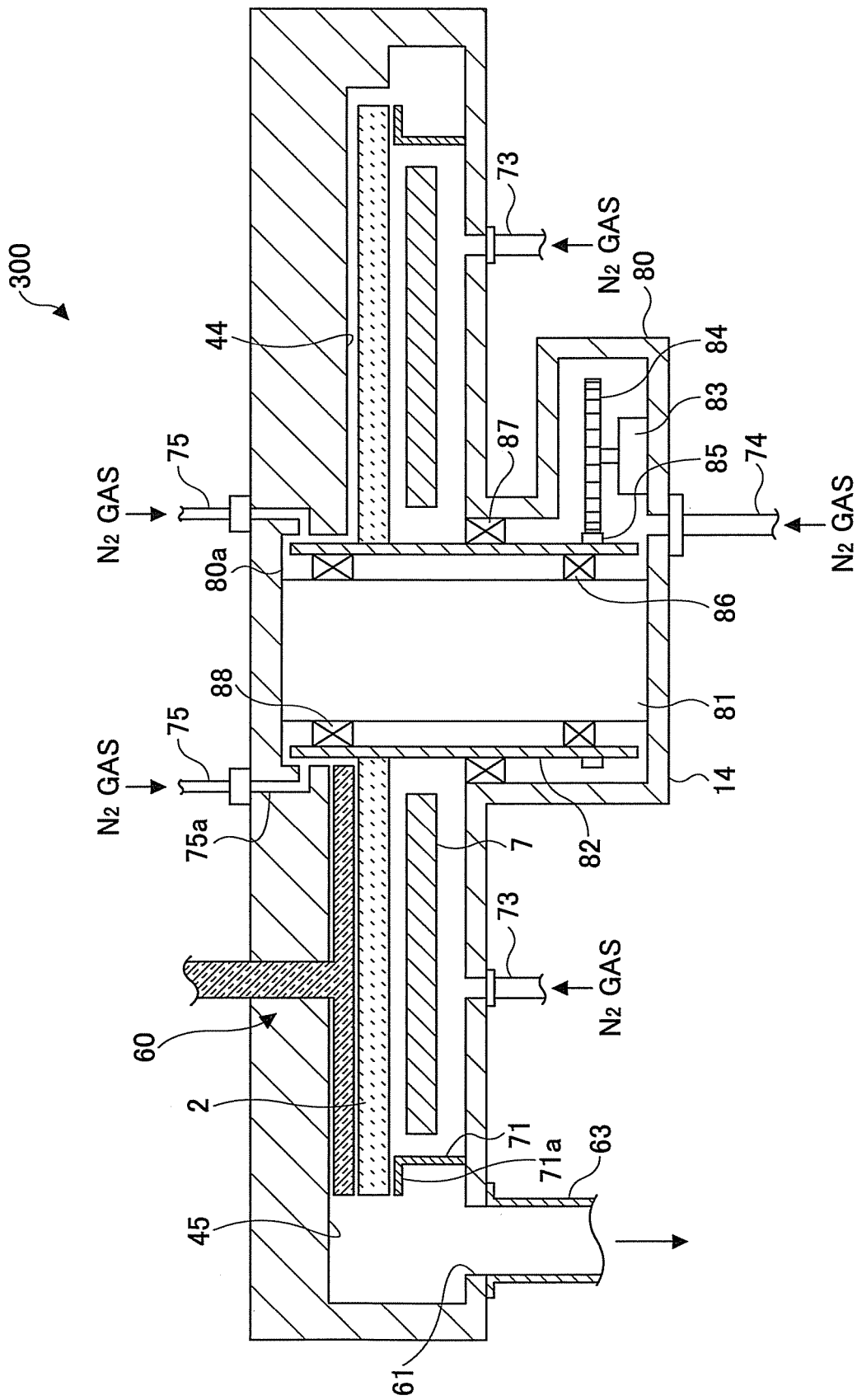
FIG. 19 is a schematic view illustrating a film deposition apparatus according to another embodiment of the present invention.

In addition, the separation area D may be configured by attaching two sector-shaped plates on the bottom surface of the ceiling plate 1 with screws so that the two sector-shaped plates are located one on each side of the separation gas nozzle 41 (42), as stated above. FIG. 19 is a plan view of such a configuration. In this case, the distance between the convex portion 4 and the separation gas nozzle 41 (42), and the size of the convex portion 4 can be determined taking into consideration ejection rates of the separation gas and the reaction gas in order to effectively demonstrate the separation function of the separation area D.

Figure 18:
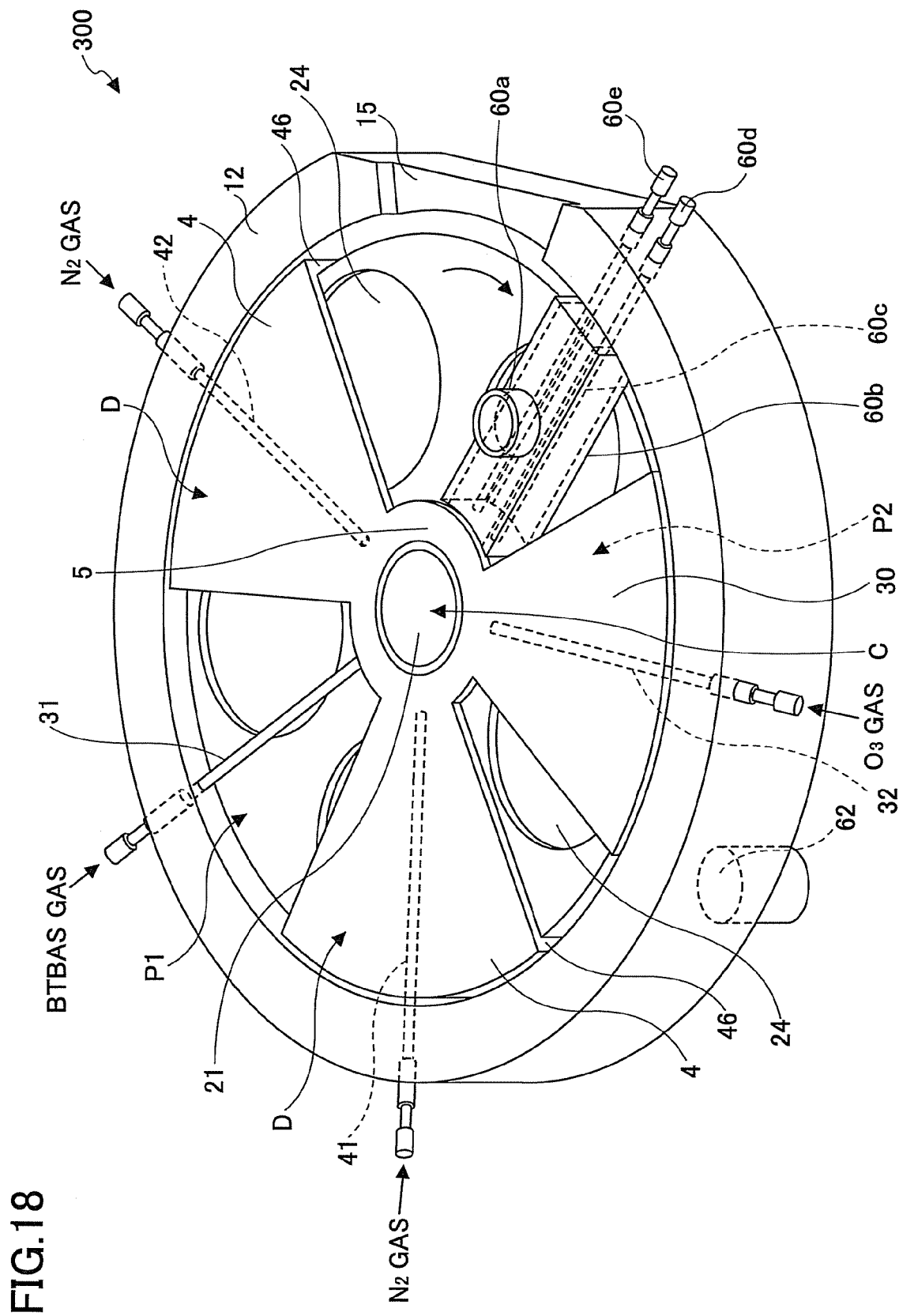
FIG. 18 illustrates an example where the convex portion is provided with respect to the reaction gas supplying nozzle in the film deposition apparatus of FIG. 1.

In the above embodiment, the first process area P1 and the second process area P2 correspond to the areas having the ceiling surface 45 higher than the ceiling surface 44 of the separation area D. However, at least one of the first process area P1 and the second process area P2 may have another ceiling surface that opposes the susceptor 2 in both sides of the reaction gas supplying nozzle 31 (32) and is lower than the ceiling surface 45 in order to prevent gas from flowing into a gap between the ceiling surface concerned and the susceptor 2. This ceiling surface, which is lower than the ceiling surface 45, may be as low as the ceiling surface 44 of the separation area D. FIG. 18 shows an example of such a configuration. As shown, a sector-shaped convex portion 30 is located in the second process area P2, where $O_3$ gas is adsorbed on the wafer W, and the reaction gas nozzle 32 is located in the groove portion (not shown) formed in the convex portion 30. In other words, this second process area P2 shown in FIG. 18 is configured in the same manner as the separation area D, while the gas nozzle is used in order to supply the reaction gas. In addition, the convex portion 30 may be configured as a hollow convex portion, an example of which is illustrated in the subsections (a) through (c) of FIG. 14.

In the above embodiments, the rotational shaft 22 for rotating the susceptor 2 is located in the center portion of the vacuum chamber 1. In addition, the space 52 between the core portion 21 and the ceiling plate 11 is purged with the separation gas in order to prevent the reaction gases from being intermixed through the center portion. However, the vacuum chamber 1 may be configured as shown in FIG. 19 in other embodiments. Referring to FIG. 19, the bottom portion 14 of the chamber body 12 has a center opening to which a housing case 80 is hermetically attached. Additionally, the ceiling plate 11 has a center concave portion 80a. A pillar 81 is placed on the bottom surface of the housing case 80, and a top end portion of the pillar 81 reaches a bottom surface of the center concave portion 80a. The pillar 81 can prevent the first reaction gas (BTBAS) ejected from the first reaction gas nozzle 31 and the second reaction gas ($O_3$) ejected from the second reaction gas nozzle 32 from being intermixed through the center portion of the vacuum chamber 1.

In addition, a rotation sleeve 82 is provided so that the rotation sleeve 82 coaxially surrounds the pillar 81. The rotation sleeve 82 is supported by bearings 86, 88 attached on an outer surface of the pillar 81 and a bearing 87 attached on an inner side wall of the housing case 80. Moreover, the rotation sleeve 82 has a gear portion 85 formed or attached on an outer surface of the rotation sleeve 82. Furthermore, an inner circumference of the ring-shaped susceptor 2 is attached on the outer surface of the rotation sleeve 82. A driving portion 83 is housed in the housing case 80 and has a gear 84 attached to a shaft extending from the driving portion 83. The gear 84 is meshed with the gear portion 85. With such a configuration, the rotation sleeve 82 and thus the susceptor 2 are rotated by the driving portion 83.

A purge gas supplying pipe 74 is connected to an opening formed in a bottom of the housing case 80, so that a purge gas is supplied into the housing case 80. With this, an inner space of the housing case 80 may be kept at a higher pressure than an inner space of the chamber 1, in order to prevent the reaction gases from flowing into the housing case 80. Therefore, no film deposition takes place in the housing case 80, thereby reducing maintenance frequency. In addition, purge gas supplying pipes 75 are connected to corresponding conduits 75a that reach from an upper outer surface of the chamber 1 to an inner side wall of the concave portion 80a, so that a purge gas is supplied toward an upper end portion of the rotation sleeve 82. Because of the purge gas, the BTBAS gas and the $O_3$ gas cannot be mixed through a space between the outer surface of the rotation sleeve 82 and the side wall of the concave portion 80a. Although the two purge gas supplying pipes 75 are illustrated in FIG. 19, the number of the pipes 75 and the corresponding conduits 75a may be determined so that the purge gas from the pipes 75 can assuredly prevent gas mixture of the BTBAS gas and the $O_3$ gas in and around the space between the outer surface of the rotation sleeve 82 and the side wall of the concave portion 80a.

In the embodiment illustrated in FIG. 19, a space between the side wall of the concave portion 80a and the upper end portion of the rotation sleeve 82 corresponds to the ejection hole for ejecting the separation gas. In addition, the center area located at a center portion of the vacuum chamber 1 is configured with the ejection hole, the rotation sleeve 82, and the pillar 81.

Referring to FIG. 19, the cleaning nozzle 60 is arranged between the high ceiling surface 45 and the susceptor 2. This cleaning nozzle 60 has substantially the same configuration as that explained with reference to FIGS. 1, 3, and 5. Therefore, the film deposition apparatus shown in FIG. 19 according to another embodiment of the present invention can provide the same advantages and effects as those provided by the film deposition apparatus 300 according to the above embodiment.

In the film deposition apparatus 300, three or more kinds of reaction gases may be used, and is not limited to the two kinds of the reaction gases in other embodiments. In this case, a first reaction gas nozzle, a separation gas nozzle, a second reaction gas nozzle, a separation gas nozzle, and a third reaction gas nozzle may be located in this order at predetermined angular intervals, each nozzle extending along the radial direction of the susceptor 2. Additionally, the separation areas D including the corresponding separation gas nozzles are configured in the same manner as explained above.

The cleaning nozzle 60 of the film deposition apparatus 300 shown in FIG. 1 and the film deposition apparatus shown in FIG. 19 according to an embodiment of the present invention may be variously modified or altered. For example, the cleaning nozzle 60 is not necessarily attached in the positions as illustrated in FIGS. 1 and 19, but may be arranged in an arbitrary position, as long as the cleaning nozzle 60 does not disturb the flows of the gases from the first and the second reaction gas nozzles 31, 32 during film deposition. In addition, while the cleaning nozzle 60 has one evacuation pipe 60a in the illustrated example, two or more evacuation pipes may be provided in the cleaning nozzle 60. Moreover, the evacuation pipe 60a may have a shape of a slit rather than a cylinder shape. Even when the number and/or the shape of the evacuation pipes 60a are altered, the cleaning nozzle 60 is hermetically attached to the vacuum chamber 1. Moreover, the outer hood member 60b is directly attached on the high ceiling surface 45 of the ceiling member 11.

The opening directions of the holes 60f, 60g formed in the gas nozzles 60d, 60e, respectively, are not limited to those described above, but may be toward the upper surface of the susceptor 2, for example. In addition, while the outer hood member 60b and the inner hood member 60c have a cross section of an inverted square U-shape, they may have a cross section of an inverted U-shape, an inverted V-shape, or an inverted C-shape, which are open toward the upper surface of the susceptor 2.

Although the cleaning gas(es) should not be supplied to the cleaning nozzle 60 when film deposition is being carried out in the film deposition 300, $N_2$ gas or inert gas may be flowed from the gas nozzles 60d, 60e, and in turn evacuated through the gas passage (the space between the outer hood member 60b and the inner hood member 60c) and the evacuation pipe 60a, which may further prevent the reaction gases (e.g., BTBAS and $O_3$) from being intermixed.

The cleaning gas(es) supplied from the gas nozzles 60d, 60e of the cleaning nozzle 60 are chosen depending on the film deposited in the film deposition apparatus 300. For example, when the film deposition apparatus 300 is used for silicon nitride deposition, $ClF_3$ gas may be used as the cleaning gas, rather than a combination of H2 gas and $F_2$ gas. In addition, $ClF_3$ gas may be used to remove silicon oxide deposits, whereas HF is mainly used to remove silicon oxide deposits. Incidentally, one kind of cleaning gas such as $ClF_3$ gas and HF may be supplied from both of or either one of the gas nozzles 60d, 60e. In addition, the cleaning nozzle 60 may have only one gas nozzle, which is preferable when $ClF_3$ gas or HF gas is used as the cleaning gas.

Moreover, chlorine ($Cl_2$) gas and/or fluorine ($F_2$) gas may be used as the cleaning gas. In this case, $Cl_2$ gas is supplied from one of the gas nozzles 60d, 60e, and $F_2$ gas is supplied from the other one of the gas nozzles 60d, 60e. In addition, only the $Cl_2$ gas is supplied from both of or either one of the gas nozzles 60d, 60e, or only the $F_2$ gas is supplied from both of or either one of the gas nozzles 60d, 60e. Moreover, when the cleaning nozzle 60 has only one gas nozzle, one of $Cl_2$ gas and $F_2$ gas may be supplied from the gas nozzle. Furthermore, a gas mixture of $Cl_2$ gas and $F_2$ gas may be supplied from both of or either one of the gas nozzles 60d, 60e, or from one gas nozzle when the cleaning gas nozzle 60 has only one gas nozzle.

Figure 20:
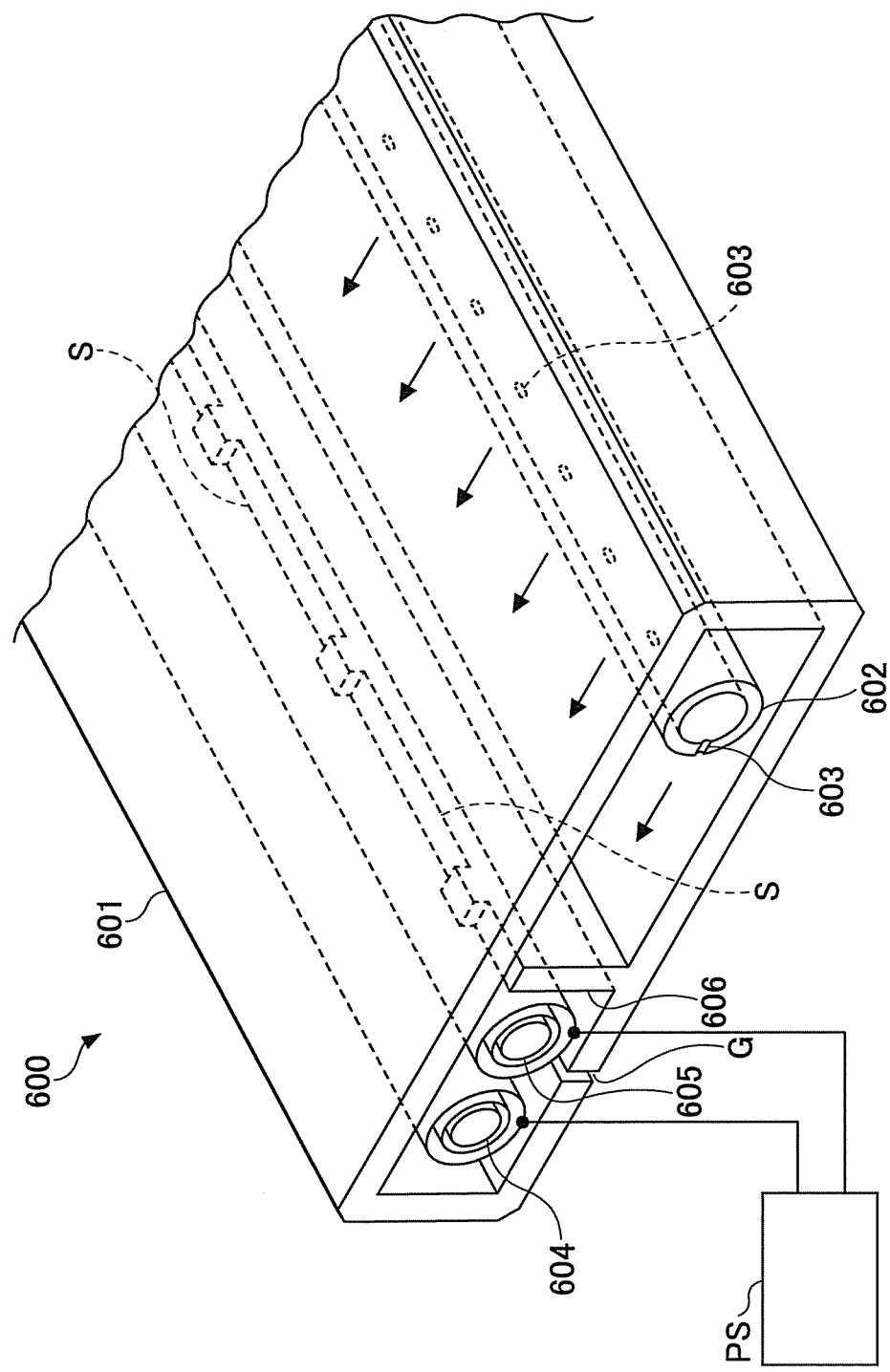
FIG. 20 is an explanatory view for explaining a modification example of the cleaning nozzle illustrated in FIG. 5.
Figure 21:
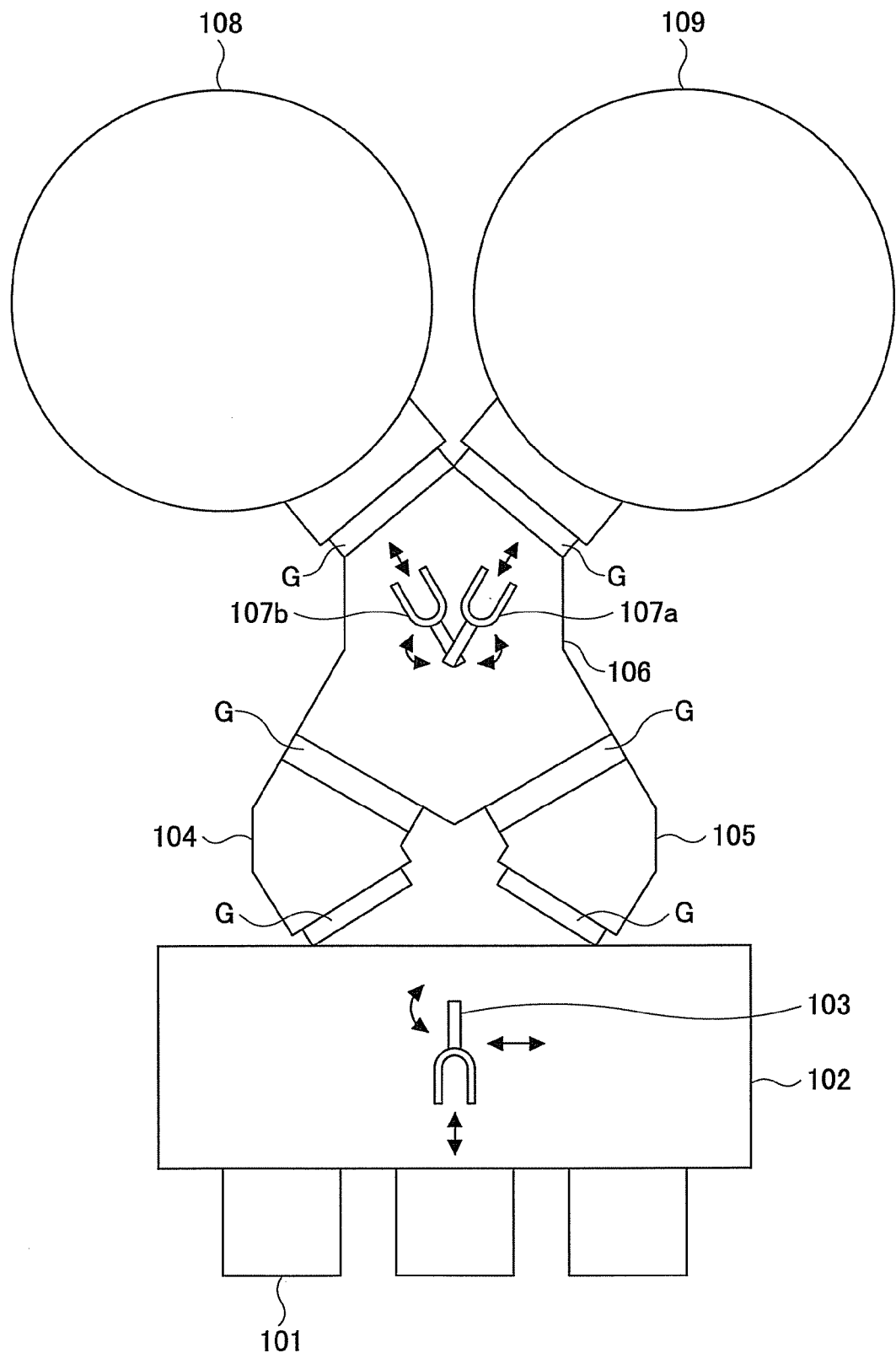
FIG. 21 is a schematic view illustrating a substrate processing apparatus including the film deposition apparatus shown in FIG. 1 or 19.

Moreover, $NF_3$ gas may be used as the cleaning gas. However, $NF_3$ gas is preferably activated by plasma because $NF_3$ has relatively low reactivity (corrosivity) so that deposits on the susceptor cannot be sufficiently removed when $NF_3$ gas is used as it is. Another configuration of the cleaning nozzle 60 preferable for the gas having relatively low reactivity is explained in the following. FIG. 20 is a perspective view of a modification example of the cleaning nozzle 60, specifically illustrating a plasma generator 600 provided in the cleaning nozzle 60. The cleaning nozzle 60 according to this example includes the plasma generator 600, which corresponds to the inner hood member 60c, and the outer hood member 60b arranged outside the plasma generator 600.

As shown in FIG. 20, the plasma generator 600 includes an outer frame 601, which extends along the longitudinal direction of the outer hood member 60b, a partition wall 606 that separates the inner space of the outer frame 601 into a first chamber and a second chamber, electrodes 604, 605 extending along a longitudinal direction of the outer frame 601 and in parallel with each other in the first chamber, and a gas nozzle 602 extending along the longitudinal direction of the outer frame 601 in the second chamber.

The outer frame 601 has a concave member, which is similar to the inner hood member 60c (the subsection (b) of FIG. 5), and a cover plate that covers an opening of the concave member in this example.

The gas nozzle 602 is introduced to the second chamber, penetrating the side circumferential wall of the chamber body 12, similar to the gas nozzles 60d, 60e of the cleaning nozzle 60 (see FIG. 3), and connected at a base end portion (gas inlet port) to a $NF_3$ gas supplying source (not shown). In addition, the gas nozzle 602 has plural holes 603 open toward the partition wall 606 through which the $NF_3$ gas from the $NF_3$ gas supplying source is supplied to the second chamber.

Slits S having a predetermined length are formed in an upper portion of the partition wall 606. With this, the $NF_3$ gas is gradually flowed out to the first chamber from the second chamber.

The electrodes 604, 605 are connected to a high frequency power source PS via feedthroughs (not shown) attached in the side circumferential wall of the chamber body 12, and high frequency power is applied to the electrodes 604, 605 from the high frequency power source PS. A frequency of the high frequency power may be 915 MHz, 2.45 GHz, or 8.3 GHz, for example. When the high frequency power having such a frequency is supplied to the electrodes 604, 605, a high frequency electromagnetic field is generated between the electrodes 604, 605, which activates the $NF_3$ gas that has reached a space between the electrodes 604, 605 through the slits S from the gas nozzle 602, thereby generating plasma in the space between the electrodes 604, 605. In addition, a slit G is formed in the cover plate of the outer frame 601 below the space between the electrodes 604, 605 in the first chamber, and activated molecular species in the plasma are supplied toward the upper surface of the susceptor 2 (see the subsection (b) of FIG. 5) through the slit G. By the activated molecular species so supplied, the deposits on the susceptor 2 are decomposed and removed. In addition, the activated molecular species remaining unreacted above the susceptor 2 (especially, the activated molecular species having a longer life), reaction products generated through the decomposition of the deposits, and the like are evacuated through the space (the gas passage) between the plasma generator 600 and the outer hood member 60b arranged outside the plasma generator 600 and the evacuation pipe 60a. Moreover, the $N_2$ gases supplied from the separation gas nozzles 41, 42 to the vacuum chamber 1 may be evacuated into the gas passage through the gap G1 (the subsection (b) of FIG. 5) between the outer hood member 60b and the susceptor 2, and thus the activated molecular species are prevented from flowing out to the inner space of the vacuum chamber 1.

Incidentally, $C_2F_6$ gas or $C_3F_6$ gas, for example, may be supplied to the gas nozzle 602 of the plasma generator 600, not limited to $NF_3$ gas, depending on the deposits to be removed. In addition, $Cl_2$ gas, $F_2$ gas, or a combination of these two gases may be supplied to the gas nozzle 602 as the cleaning gas(es).

Moreover, while the inner space of the plasma generator 600 is divided into the first chamber and the second chamber, a third chamber may be provided next to the first chamber in such a manner that the third chamber, the first chamber, and the second chamber are arranged side-by-side in this order, where another partition wall 606 are arranged between the first chamber and the third chamber.

In addition, while the cleaning nozzle 60 (including the cleaning nozzle 60 with the plasma generator 600) is provided in the film deposition apparatus as an MLD apparatus in the above embodiments, the cleaning nozzle 60 is applicable to other film deposition apparatuses, not limited to an MLD apparatus. For example, the cleaning nozzle 60 may be provided in a film deposition apparatus including a susceptor rotatably provided in a chamber and having a substrate receiving portion in one surface of the susceptor; a reaction gas supplying portion that supplies reaction gases to the one surface; and an evacuation opening formed in the chamber in order to evacuate the chamber. Even in this case, the cleaning gas(es) is supplied to the space having an inverted concave shape, the space being defined by a first concave member provided above and open toward the one surface of the susceptor in the chamber; the susceptor is rotated; and the cleaning gas(es) is evacuated through the gas passage between the first concave member and a second concave member arranged above a second concave member, thereby providing the same advantages and effects of the cleaning nozzle 60.

The film deposition apparatus according to embodiments of the present invention may be integrated into a wafer process apparatus, an example of which is schematically illustrated in FIG. 19. The wafer process apparatus includes an atmospheric transfer chamber 102 in which a transfer arm 103 is provided, a load lock chamber (preparation chamber) 105 whose atmosphere is changeable between vacuum and atmospheric pressure, a vacuum transfer chamber 106 in which two transfer arms 107a, 107b are provided, and film deposition apparatuses 108, 109 according to embodiments of the present invention. In addition, the wafer process apparatus includes cassette stages (not shown) on which a wafer cassette 101 such as a Front Opening Unified Pod (FOUP) is placed. The wafer cassette 101 is brought onto one of the cassette stages, and connected to a transfer in/out port provided between the cassette stage and the atmospheric transfer chamber 102. Then, a lid of the wafer cassette (FOP) 101 is opened by an opening/closing mechanism (not shown) and the wafer is taken out from the wafer cassette 101 by the transfer arm 103. Next, the wafer is transferred to the load lock chamber 104 (105). After the load lock chamber 104 (105) is evacuated, the wafer in the load lock chamber 104 (105) is transferred further to one of the film deposition apparatuses 108, 109 through the vacuum transfer chamber 106 by the transfer arm 107a (107b). In the film deposition apparatus 108 (109), a film is deposited on the wafer in such a manner as described above. Because the wafer process apparatus has two film deposition apparatuses 108, 109 that can house five wafers at a time, the ALD (or MLD) mode deposition can be performed at high throughput.

The present invention is not limited to the disclosed embodiments and examples, but may be modified or altered with in the scope of the accompanying Claims.

What is claimed is:

1. A film deposition apparatus comprising:
a susceptor rotatably provided in a chamber;
a substrate receiving portion that is provided in one surface of the susceptor and in which a substrate is placed;
a reaction gas supplying member configured to supply a reaction gas to the one surface of the susceptor;
a cleaning member including:
a first concave member that has an inverted concave shape and is provided above the susceptor and open toward the one surface, thereby defining a space of an inverted concavity, the first concave member extending substantially along a radius direction of the susceptor,
a second concave member that is provided over the first concave member in order to define a gas passage between the first concave member and the second concave member, the gas passage extending substantially along the radius direction of the susceptor,
a cleaning gas supplying portion configured to supply a cleaning gas to the space defined by the first concave member and extending in the radius direction so as to be parallel with the first and second concave members and covered at upper and lateral sides thereof by the first and second concave members, said gas supplying portion including first and second gas nozzles, each of the first and second gas nozzles having a plurality of holes for supplying the cleaning gas, said holes of the first gas nozzle being located so as to face the holes of the second gas nozzle, and
an evacuation pipe configured to be in gaseous communication with the gas passage and to extend out from the chamber; and
an evacuation opening provided in the chamber in order to evacuate the chamber,
wherein the first concave member has a first opening end portion and the second concave member has a second opening end portion, said first and second opening end portions being arranged to define an opening end that directly faces the one surface of the susceptor for sucking the gas to be evacuated through the evacuation pipe and the evacuation opening, and the opening end extends substantially along the radius direction of the susceptor.

2. The film deposition apparatus of claim 1, wherein the reaction gas supplying member includes:
- a first reaction gas supplying portion configured to supply a first reaction gas to the one surface,
- a second reaction gas supplying portion configured to supply a second reaction gas to the one surface, the second reaction gas supplying portion being separated from the first reaction gas supplying portion along a rotation direction of the susceptor;

wherein the film deposition apparatus further comprises:
- a separation area located along the rotation direction between a first process area in which the first reaction gas is supplied and a second process area in which the second reaction gas is supplied; and
- a center area that is located substantially in a center portion of the chamber in order to separate the first process area and the second process area, and that has an ejection hole that ejects a first separation gas along the one surface;

wherein the separation area includes a separation gas supplying portion that supplies a second separation gas, and a ceiling surface that creates in relation to the one surface of the susceptor a thin space in which the second separation gas may flow from the separation area toward the first and second process areas substantially along the rotation direction.

3. The film deposition apparatus of claim 1, wherein hydrogen fluoride gas is supplied from the first gas nozzle.

4. The film deposition apparatus of claim 1, wherein hydrogen gas is supplied from the first gas nozzle and fluorine gas is supplied from the second gas nozzle.

5. The film deposition apparatus of claim 1, wherein chlorine gas is supplied from the first gas nozzle and fluorine gas is supplied from the second gas nozzle.

6. The film deposition apparatus of claim 1, further comprising:
- two electrodes extending along the one surface of the susceptor in the space defined by the first concave member; and
- a high frequency power supply configured to apply high frequency power across the two electrodes.

7. The film deposition apparatus of claim 1, wherein the first opening end and the one surface of the susceptor forms a first gap, and the second opening end and the one surface of the susceptor forms a second gap that is smaller than the first gap.

* * * * *